US00RE50466E

(19) United States
(12) Reissued Patent
Lee et al.

(10) Patent Number: US RE50,466 E
(45) Date of Reissued Patent: Jun. 24, 2025

(54) DISPLAY DEVICE AND MOBILE INFORMATION TERMINAL INCLUDING THE SAME

(71) Applicant: LG Display Co., Ltd., Seoul (KR)

(72) Inventors: Guensik Lee, Paju-si (KR); Kyoseop Choo, Paju-si (KR); Manhyeop Han, Paju-si (KR); Junghoon Lee, Paju-si (KR)

(73) Assignee: LG Display Co., Ltd., Seoul (KR)

(21) Appl. No.: 17/714,703

(22) Filed: Apr. 6, 2022

Related U.S. Patent Documents

Reissue of:
(64) Patent No.: 10,691,910
Issued: Jun. 23, 2020
Appl. No.: 16/126,943
Filed: Sep. 10, 2018

(30) Foreign Application Priority Data

Sep. 11, 2017 (KR) ..... 10-2017-0115862

(51) Int. Cl.
*G06K 9/00* (2022.01)
*G06F 1/16* (2006.01)
(Continued)

(52) U.S. Cl.
CPC ..... *G06F 1/1601* (2013.01); *G06F 1/1635* (2013.01); *G06F 1/1637* (2013.01); *G06F 1/1684* (2013.01); *G06F 3/0412* (2013.01); *G06V 40/1318* (2022.01); *H05K 1/189* (2013.01); *G06V 40/1341* (2022.01)

(58) Field of Classification Search
CPC .... G06F 1/1601; G06F 1/1635; G06F 1/1637; G06F 1/1684; G06F 3/0412; G06V 40/1318; G06V 40/1341; G06V 40/1324; H05K 1/189; G09F 9/301; H04M 1/0266
See application file for complete search history.

(56) References Cited

U.S. PATENT DOCUMENTS 5,241,606 A * 8/1993 Horie ..... G01B 11/24 356/608
6,950,541 B1 * 9/2005 Setlak ..... G06V 40/1306 382/126
(Continued)

FOREIGN PATENT DOCUMENTS

CN 105095861 A 11/2015
CN 105184282 A 12/2015
(Continued)

OTHER PUBLICATIONS

Korean Intellectual Property Administration, Office Action, KR Patent Application No. 10-2017-0115862, Jan. 27, 2022, 13 pages.
(Continued)

*Primary Examiner* — Colin M LaRose
(74) *Attorney, Agent, or Firm* — Fenwick & West LLP

(57) ABSTRACT

A display device and a mobile information terminal including the same are disclosed. The display device includes a display panel on which a fingerprint is touched, and a fingerprint sensor coupled to the display panel configured to sense light reflected from the fingerprint on a display area of the display panel. The fingerprint sensor is attached obliquely on the display panel at a predetermined angle to a reference line parallel to a long axis of the display panel.

13 Claims, 26 Drawing Sheets

(51) Int. Cl.

| | |
|---|---|
| ***G06F 3/041*** | (2006.01) |
| ***G06V 40/13*** | (2022.01) |
| ***H05K 1/18*** | (2006.01) |
| *G06V 40/12* | (2022.01) |

(56) References Cited

U.S. PATENT DOCUMENTS

| | | | | |
|---|---|---|---|---|
| 6,960,788 | B2 | 11/2005 | Joo et al. | |
| 9,013,613 | B2 | 4/2015 | Ogita et al. | |
| 9,652,563 | B2 | 5/2017 | Chang et al. | |
| 9,996,724 | B2 | 6/2018 | Gao et al. | |
| 10,025,421 | B2 | 7/2018 | Kim et al. | |
| 10,311,276 | B2 * | 6/2019 | Mackey | G06V 40/1318 |
| 10,366,272 | B2 * | 7/2019 | Song | G06V 40/1318 |
| 10,410,036 | B2 | 9/2019 | He et al. | |
| 2004/0211960 | A1 | 10/2004 | Joo et al. | |
| 2005/0200291 | A1 * | 9/2005 | Naugler | H10K 59/40 315/149 |
| 2007/0013679 | A1 | 1/2007 | Gruhlke | |
| 2012/0069042 | A1 | 3/2012 | Ogita et al. | |
| 2013/0063399 | A1 | 3/2013 | Noro et al. | |
| 2014/0172379 | A1 | 6/2014 | Chang et al. | |
| 2016/0093240 | A1 | 3/2016 | Aurongzeb et al. | |
| 2016/0140380 | A1 | 5/2016 | Carver et al. | |
| 2016/0227654 | A1 | 8/2016 | Kim et al. | |
| 2016/0266695 | A1 | 9/2016 | Bae et al. | |
| 2016/0306487 | A1 | 10/2016 | Jeong et al. | |
| 2017/0016720 | A1 | 1/2017 | Choi et al. | |
| 2017/0045918 | A1 | 2/2017 | Han et al. | |
| 2017/0090647 | A1 | 3/2017 | Kim et al. | |
| 2017/0205958 | A1 | 7/2017 | Kurasawa | |
| 2017/0220838 | A1 | 8/2017 | He et al. | |
| 2017/0270340 | A1 | 9/2017 | Gao et al. | |
| 2017/0315293 | A1 | 11/2017 | Bang et al. | |
| 2017/0330015 | A1 * | 11/2017 | Pierce | G06K 9/00067 |
| 2018/0330141 | A1 * | 11/2018 | Yang | G06F 3/0412 |
| 2019/0012512 | A1 * | 1/2019 | He | G06K 9/00087 |

FOREIGN PATENT DOCUMENTS

| | | | |
|---|---|---|---|
| CN | 204990360 | U | 1/2016 |
| CN | 205334502 | U | 6/2016 |
| CN | 106415462 | A | 2/2017 |
| CN | 206226404 | U | 6/2017 |
| CN | 106940488 | A | 7/2017 |
| CN | 107004130 | A | 8/2017 |
| JP | 2004-326806 | A | 11/2004 |
| JP | 2005-242841 | A | 9/2005 |
| JP | 2006-086333 | A | 3/2006 |
| JP | 2012-070356 | A | 4/2012 |
| JP | 2015-201164 | A | 11/2015 |
| KR | 10-2004-0092704 | A | 11/2004 |
| KR | 10-2016-0122900 | A | 10/2016 |
| KR | 10-2014-0078563 | A | 11/2017 |
| KR | 10-2017-0124160 | A | 11/2017 |
| TW | 1575437 | B | 3/2017 |
| WO | WO 2009/010940 | A2 | 1/2009 |
| WO | WO 2015/108477 | A1 | 7/2015 |

OTHER PUBLICATIONS

China National Intellectual Property Administration, Office Action, Chinese Patent Application No. 202111674135.2, Aug. 22, 2024, 14 pages.

Office Action, Japanese Patent Application No. 2018-169651, dated Aug. 6, 2019, 21 pages.

Office Action, Taiwanese Patent Application No. 107131816, dated Aug. 6, 2019, 11 pages.

Extended European Search Report, European Patent Application No. 18193878.8, dated Dec. 21, 2018, 9 pages.

Office Action, European Patent Application No. 18193878.8, dated Nov. 22, 2019, 8 pages.

* cited by examiner $T_{CP_AIR} < \alpha < T_{VHOE_LR} < \theta$ ex) $45° < \alpha < 55°$ $70° < \theta < 75°$

DISPLAY DEVICE AND MOBILE INFORMATION TERMINAL INCLUDING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application *is a reissue of U.S. Pat. No. 10,691,910 issued on Jun. 23, 2020, which was filed as U.S. patent application Ser. No. 16/126,943 on Sep. 10, 2018, which* claims the benefit of Republic of Korea Patent Application No. 10-2017-0115862 filed on Sep. 11, 2017, the entire contents of which is incorporated by reference in its entirety.

BACKGROUND

Field of Technology

The present disclosure relates to a display device sensing a fingerprint at a screen (i.e., a display area) displaying an image and a mobile information terminal including the display device.

Discussion of the Related Art

An electroluminescent display is classified into an inorganic electroluminescent display and an organic electroluminescent display depending on a material of an emission layer. An active matrix organic light emitting diode (OLED) display includes a plurality of OLEDs capable of emitting light by themselves and has many advantages of fast response time, high emission efficiency, high luminance, wide viewing angle, and the like.

The OLED includes an anode, a cathode, and an organic compound layer between the anode and the cathode. The organic compound layer generally includes a hole injection layer HIL, a hole transport layer HTL, an emission layer EML, an electron transport layer ETL, and an electron injection layer EIL. When a power voltage is applied to the anode and the cathode, holes passing through the hole transport layer HTL and electrons passing through the electron transport layer ETL move to the emission layer EML and combine, thereby forming excitons. As a result, the emission layer EML generates visible light by the excitons.

A fingerprint sensor applied to a mobile information terminal is disposed at a specific location outside the screen, like the home button. The fingerprint sensor may be disposed in a bezel area outside the screen, but may result in an increase in the bezel area. A structure of a display panel may be changed so that the fingerprint sensor is disposed on the display panel.

The fingerprint sensor may be disposed on a liquid crystal display. When the fingerprint sensor is disposed between a display panel and a backlight unit of the liquid crystal display, the fingerprint sensor is visible in a screen area. A prism sheet of the backlight unit has many air gaps because of its structure. Because reception efficiency of the fingerprint sensor is reduced due to the air gaps, the fingerprint sensor cannot be disposed below the screen area of the liquid crystal display.

SUMMARY

The present disclosure provides a display device capable of sensing a fingerprint at a screen without moire interference and a mobile information terminal including the display device.

In one aspect, there is provided a display device including a display panel on which a fingerprint is touched, and a fingerprint sensor coupled to the display panel configured to sense light reflected from the fingerprint on a display area of the display panel. The light reflected from the fingerprint is incident on the fingerprint sensor through the display panel. The fingerprint sensor is attached obliquely on the display panel at a predetermined angle to a reference line parallel to a long axis of the display panel.

The predetermined angle is an angle of 20° to 45° to the reference line.

The display device further includes a flexible circuit board on which the fingerprint sensor is mounted.

The flexible circuit board includes a sensor mounting portion on which the fingerprint sensor is mounted, and a tail portion connected to the sensor mounting portion and connected to a main board.

An attachment direction line of the fingerprint sensor passes through a center of the fingerprint sensor and a center of a width direction of the flexible circuit board and intersects the reference line. An angle of the attachment direction line of the fingerprint sensor with respect to the reference line is 20° to 45°.

The tail portion of the flexible circuit board includes a first tail portion positioned close to the sensor mounting portion and a second tail portion bent from the first tail portion at a predetermined angle.

The fingerprint sensor and the sensor mounting portion of the flexible circuit board are disposed at an angle of 20° to 45° to the reference line. The first tail portion is connected to the sensor mounting portion and is extended at an angle of 20° to 45° to the reference line. The second tail portion is bent from the first tail portion at a minor angle of 110° to 135°.

The fingerprint sensor and the sensor mounting portion of the flexible circuit board are disposed at an angle of 20° to 45° to the reference line. The tail portion is connected to the sensor mounting portion and is bent from the sensor mounting portion at a minor angle of 110° to 135°.

The fingerprint sensor and the sensor mounting portion of the flexible circuit board are disposed at an angle of 20° to 45° to the reference line. The first tail portion is extended parallel to the reference line. The second tail portion is bent from the first tail portion at a minor angle of 90°.

The fingerprint sensor is disposed at an angle of 20° to 45° to the reference line. One side of the sensor mounting portion of the flexible circuit board is parallel to the reference line. A long axis of the tail portion of the flexible circuit board is perpendicular to the reference line.

Pixels of the fingerprint sensor are arranged non-uniformly.

In another aspect, there is provided a mobile information terminal including a display panel on which a fingerprint is touched, a fingerprint sensor coupled to the display panel configured to sense light reflected from the fingerprint on a display area of the display panel, a main board connected to the fingerprint sensor, and a battery connected to the main board. The fingerprint sensor is attached obliquely on the display panel at a predetermined angle.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Figure 1:
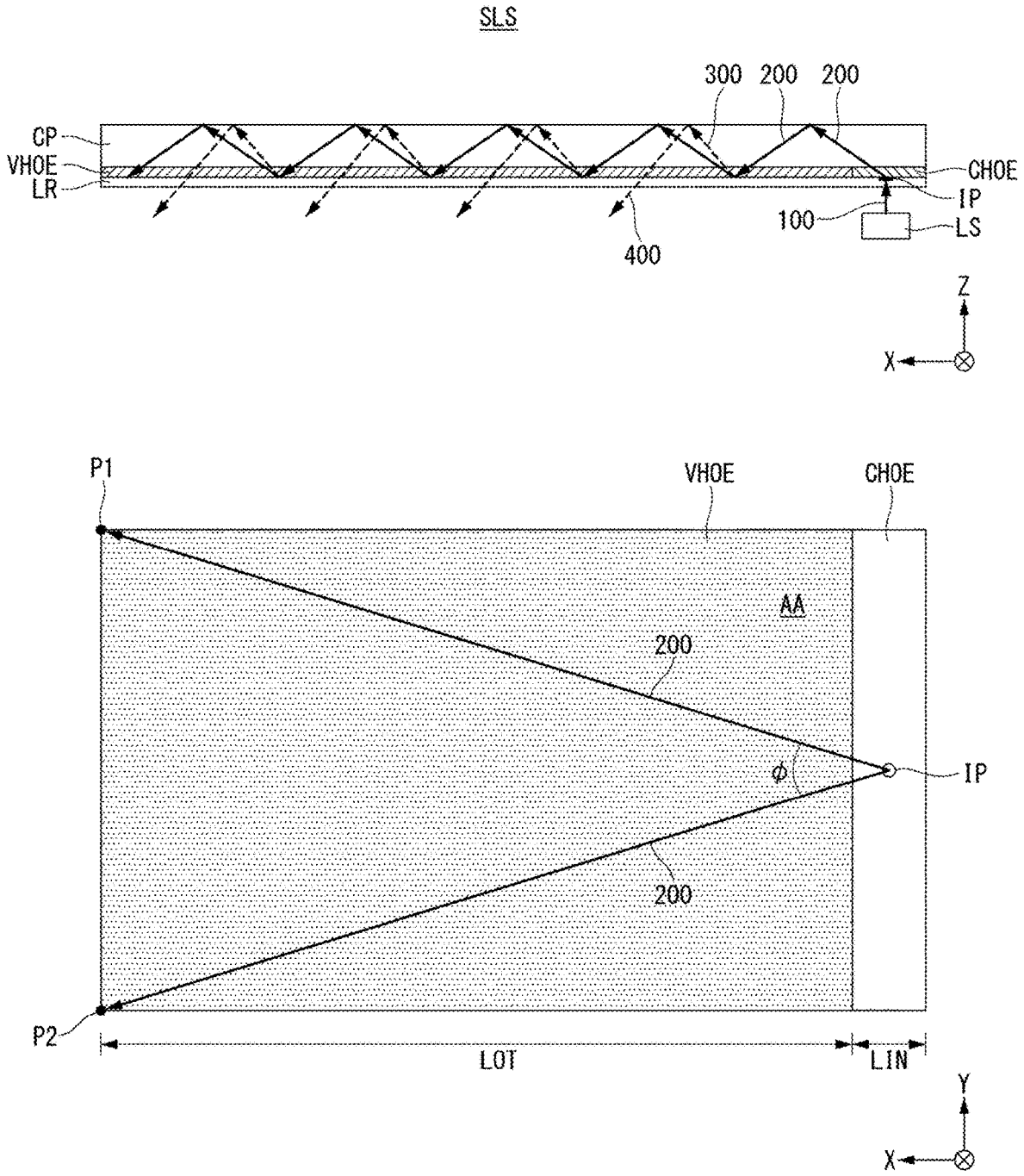
FIG. 1 is a cross-sectional view and a plan view illustrating a directional light source device according to an embodiment of the disclosure.

Reference will now be made in detail to embodiments of the disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the disclosure are merely exemplary, and the present disclosure is not limited thereto unless specified as such. Like reference numerals designate like elements throughout. In the following description, detailed descriptions of certain functions or configurations related to this document that may unnecessarily cloud the gist of the invention have been omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above", "under or below", "next to" another structure, this description should be construed as including a case in which the structures directly contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component, and vice versa, without departing from the scope of the present disclosure.

The features of embodiments of the disclosure can be partially combined or entirely combined with each other, and can be technically interlocking-driven in various ways. The embodiments can be independently implemented, or can be implemented in conjunction with each other.

A display device according to an embodiment of the disclosure includes an optical fingerprint sensor using a light source and a fingerprint sensor. In the following embodiments, the display device according to an embodiment of the disclosure is described focusing on an electroluminescent display. More specifically, embodiments of the disclosure are described focusing on an organic electroluminescent display, that is configured such that each pixel includes an organic light emitting diode (OLED) serving as a self-emission element, as an example of the electroluminescent display. However, it should be noted that the technical idea of the present disclosure is not limited to the organic electroluminescent display and may be applied to an inorganic electroluminescent display including an inorganic electroluminescent material. The display device according to an embodiment of the disclosure may be applied to a mobile information terminal. The mobile information terminal includes a cellular phone, a smart phone, a tablet computer, a notebook computer, a wearable device, and the like.

A display device according to an embodiment of the disclosure is configured such that a directional light source device SLS shown in FIGS. 1 to 5 is disposed on a display panel and a fingerprint sensor is disposed below or within the display panel, thereby sensing a fingerprint at a screen on which an input image is displayed. When a fingerprint of a user touches the directional light source device SLS, light reflected from the fingerprint is converted into an electrical signal by the fingerprint sensor and is detected as a fingerprint pattern.

Referring to FIGS. 1 to 5, a directional light source device SLS according to an embodiment of the disclosure is a light source of a fingerprint sensor coupled to a display panel DPNL. The directional light source device SLS includes a transparent substrate CP, a light source LS, a light entering element CHOE, a light exiting element VHOE, and a low refractive index layer LR. The transparent substrate CP may be a cover glass covering the display panel DPNL.

The directional light source device SLS is an optical device for diffusing collimated light into a large area within the transparent substrate CP. In one embodiment, the light source LS provides collimated light. The light source LS irradiates laser light of an infrared band or a visible band onto the light entering element CHOE.

The light entering element CHOE is disposed between the light source LS and the transparent substrate CP and refracts light from the light source LS at an angle at which light can be totally reflected within the transparent substrate CP. The light exiting element VHOE is disposed on a screen AA of the display panel DPNL and between the display panel DPNL and the transparent substrate CP. The light exiting element VHOE refracts a portion of light travelling within the transparent substrate CP so that a portion of light travelling within the transparent substrate CP can travel toward the display panel DPNL through a rear surface (or a lower surface) of the transparent substrate CP. The low refractive index layer LR is disposed between the light exiting element VHOE and the display panel DPNL and has a refractive index less than a refractive index of the light exiting element VHOE.

The light exiting element VHOE and the light entering element CHOE are attached to the rear surface of the transparent substrate CP. The light exiting element VHOE is an optical element configured to provide outgoing light 300. The screen AA of the display panel DPNL is disposed below the light exiting element VHOE. The screen AA of the display panel DPNL is a display area including a pixel array on which an input image is displayed.

The light entering element CHOE is an optical element configured to convert light from the light source LS so that light from the light source LS has collimation properties while being diffused into the transparent substrate CP. The light entering element CHOE may be disposed at an edge of the display panel DPNL so that it is opposite to the light source LS.

The light exiting element VHOE and the light entering element CHOE may be disposed on the same plane. In one embodiment, the light exiting element VHOE and the light entering element CHOE are formed in separate areas of one film in consideration of a manufacturing process. The light exiting element VHOE and the light entering element CHOE may be a holographic optical element. The light exiting element VHOE and the light entering element CHOE may be manufactured at the same time in a hologram recording process. In a state where a master film with a pattern of the light exiting element VHOE and a master film with a pattern of the light entering element CHOE are disposed adjacent to each other in the hologram recording process, a holographic pattern for light exiting element and a holographic pattern for light entering element may be simultaneously recorded on one holographic film.

A hologram recording method may be classified into a transmission recording method and a reflection recording method. The transmission recording method irradiates reference light and object light onto one surface of a holographic film and records an interference pattern on a recording surface of the holographic film. When the reference light is irradiated onto one surface of the holographic film on which information is recorded using the transmission recording method, information of the object light is reconstructed with +1st order diffracted light and −1st order diffracted light transmitted by the holographic film.

The reflection recording method irradiates reference light and object light onto a holographic film with the holographic film interposed between the reference light and object light. In the reflection recording method, the reference light is irradiated onto one surface of the holographic film, and the object light is irradiated onto the other surface of the holographic film, which is opposite to the one surface. Hence, an interference pattern of the reference light and the object light is recorded on a recording surface of the holographic film. When the reference light is irradiated onto one surface of the holographic film on which information is recorded using the reflection recording method, information of the object light is reconstructed with +1st order diffracted light and −1st order diffracted light reflected from the holographic film.

The low refractive index layer LR is disposed between the elements VHOE and the display panel DPNL, and between the elements CHOE and the display panel DPNL. The low refractive index layer LR has a refractive index less than that of the transparent substrate CP and that of the light exiting element VHOE.

The transparent substrate CP may be made of a transparent substrate having a refractive index of 1.5. Each of the light exiting element VHOE and the light entering element CHOE may be made of a transparent holographic film. A refractive index of the holographic film may be equal to or slightly greater than the refractive index of the transparent substrate CP. In the embodiments disclosed herein, it is assumed that the refractive index of each of the light exiting element VHOE and the light entering element CHOE is equal to the refractive index of the transparent substrate CP for convenience of explanation. In one embodiment, the refractive index of the low refractive index layer LR is similar to a refractive index of a fingerprint IM (i.e., a human skin) to be recognized. For example, the low refractive index layer LR may have the refractive index of about 1.4, which is close to a refractive index "1.39" of the human skin.

In one embodiment, the light source LS provides collimated light like a laser. The collimated light provided by the light source LS is incident light 100, and the incident light 100 has a predetermined cross-sectional area and is irradiated onto an incident point IP defined on the light entering element CHOE. The incident light 100 may enter in a normal direction to the surface of the incident point IP. However, embodiments are not limited thereto. For example, the incident light 100 may be incident at an angle inclined to a normal line of the surface of the incident point IP, if necessary or desired.

The light entering element CHOE refracts the incident light 100 to traveling light 200 with an incident angle and sends the traveling light 200 to the inside of the transparent substrate CP. In one embodiment, the incident angle is greater than an internal total reflection critical angle of the transparent substrate CP. As a result, the traveling light 200 travels along an X-axis direction corresponding to a longitudinal direction of the transparent substrate CP while being totally reflected within the transparent substrate CP. Because light from the light source LS is totally reflected within the transparent substrate CP, the light from the light source LS is not visible from the outside even if the light is within a visible band.

The light exiting element VHOE converts a portion of the traveling light 200 into the outgoing light 300 and refracts the outgoing light 300 toward a front surface of the transparent substrate CP. A remaining portion of the traveling light 200 is totally reflected and travels within the transparent substrate CP. The outgoing light 300 is totally reflected at the front surface of the transparent substrate CP, but passes through the low refractive index layer LR at the rear surface of the transparent substrate CP. Detection light (or referred to as "sensing light") 400 passing through the rear surface of the transparent substrate CP travels toward the display panel DPNL.

An amount of the outgoing light 300 is determined depending on light efficiency of the light exiting element VHOE. For example, when the light efficiency of the light exiting element VHOE is 3%, 3% of the incident light 100 exits as the outgoing light 300 in a first emission region where the traveling light 200 first contacts the light exiting element VHOE. Further, 97% of the incident light 100 as the traveling light 200 continues to be totally reflected and travel. Afterwards, in a second emission region, 2.91% of the incident light 100, which equals 3% of the remaining 97% of the incident light 100, exits as the outgoing light 300.

The outgoing light 300 passes through the rear surface of the transparent substrate CP until the outgoing light 300 reaches the far side of the transparent substrate CP opposite the light source LS. In order to provide a predetermined amount of the outgoing light 300 while the traveling light 200 travels within the transparent substrate CP, in one embodiment the light efficiency of the light exiting element VHOE is designed to gradually increase exponentially.

The traveling light 200 remains collimated as the incident light 100 has been collimated, when viewed on XZ plane (or referred to as "vertical plane") including a longitudinal direction axis and a thickness direction axis. In one embodiment, the traveling light 200 has a diffusion angle φ of FIG. 1 on XY plane (or referred to as "horizontal plane") including the longitudinal direction axis and a width direction axis. This is to set an image detection area correspondingly to the area of the transparent substrate CP. For example, the light exiting element VHOE is disposed corresponding to an entire area of a light output portion LOT if possible. Further, in one embodiment the diffusion angle φ is equal to or greater than an interior angle between two line segments connecting the incident point IP to two end points P1 and P2 on the other side of the transparent substrate CP opposite the light entering element CHOE.

A region where the light entering element CHOE is disposed may be defined as a light input portion LIN in one embodiment. The region where the light exiting element VHOE is disposed may be defined as the light output portion LOT in one embodiment. The light output portion LOT may be also defined as a light travel portion in which light travels in one embodiment.

When a cross-sectional area of collimated light provided by the light source LS is about 0.5 mm×0.5 mm, the light entering element CHOE may have a length corresponding to a width of the transparent substrate CP and a width of about 3 mm to 5 mm. The light entering element CHOE may be disposed across the width of the transparent substrate CP.

The incident light 100 from the light source LS enters in a normal direction to the surface of the incident point IP on the light entering element CHOE. The light entering element CHOE converts the incident light 100 into the traveling light 200, which is refracted to have an incident angle θ. The traveling light 200 propagates within the transparent substrate CP.

In one embodiment, the incident angle θ of the traveling light 200 is greater than a total reflection critical angle $T_{VHOE_LR}$ at an interface between the light exiting element VHOE and the low refractive index layer LR. For example, when the refractive indexes of the transparent substrate CP and the light exiting element VHOE are 1.5 and the refractive index of the low refractive index layer LR is 1.4, the total reflection critical angle $T_{VHOE_LR}$ at the interface between the light exiting element VHOE and the low refractive index layer LR is about 69°. Thus, in one embodiment the incident angle θ is greater than 69°. For example, the incident angle θ may be set to be between 70° and 75°.

The traveling light 200 is totally reflected at the front surface of the transparent substrate CP because the front surface of the transparent substrate CP is in contact with an air layer AIR. This is because a total reflection critical angle $T_{CP_AIR}$ at an interface between the transparent substrate CP and the air layer AIR is about 41.4°. Namely, as long as the incident angle θ is greater than the total reflection critical angle $T_{VHOE_LR}$ at the interface between the light exiting element VHOE and the low refractive index layer LR, the incident angle θ is always greater than the total reflection critical angle $T_{CP_AIR}$ at the interface between the transparent substrate CP and the air layer AIR.

Figure 2:
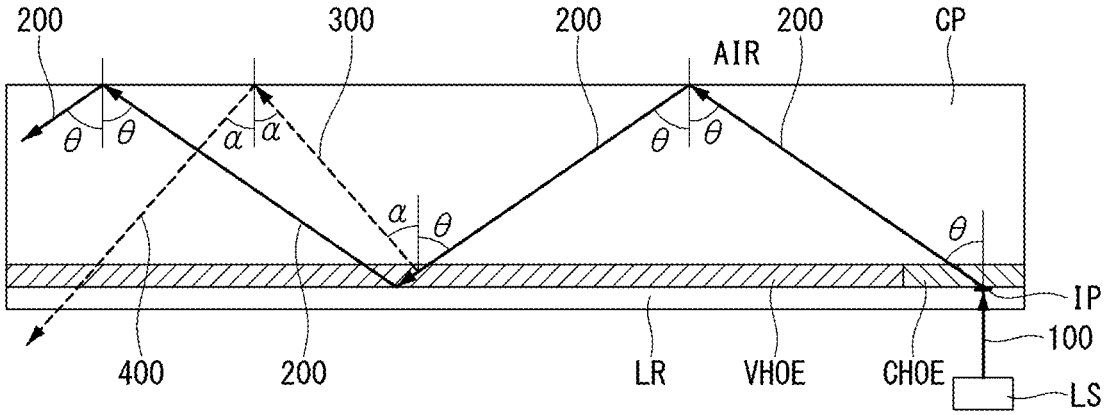
FIG. 2 is a cross-sectional view illustrating a light path in a transparent substrate shown in FIG. 1 according to an embodiment of the disclosure.

The light exiting element VHOE converts a predetermined amount of the traveling light 200 into the outgoing light 300 having a reflection angle α and sends the outgoing light 300 back to the inside of the transparent substrate CP. The outgoing light 300 is light for recognizing a pattern of the fingerprint IM touching the front surface (or the upper surface) of the transparent substrate CP. When there is no fingerprint on the surface of the transparent substrate CP, the outgoing light 300 has to be totally reflected at the front surface of the transparent substrate CP and propagate to a fingerprint sensor ISS disposed below the directional light source device SLS. After the outgoing light 300 is totally reflected at the front surface of the transparent substrate CP, the outgoing light 300 serves as the detection light 400 and propagates under the directional light source device SLS. As shown in FIG. 2, $T_{CP_AIR}<\alpha<T_{VHOE_LR}<\theta$. For example, the reflection angle α may be set to be between 45° and 55°, and the incident angle θ may be set to be between 70° and 75°.

Figure 3:
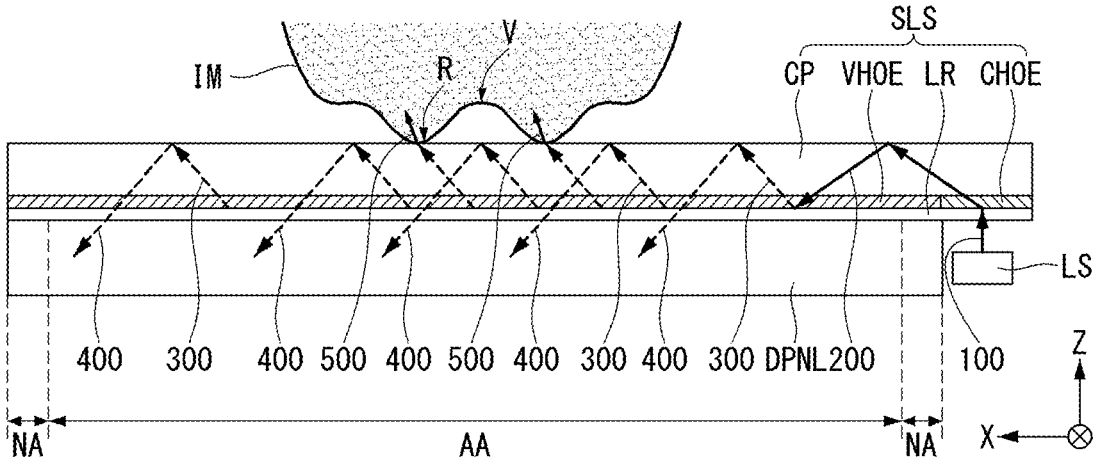
FIG. 3 is a cross-sectional view illustrating a directional light source device disposed on a display panel according to an embodiment of the disclosure.
Figure 4:
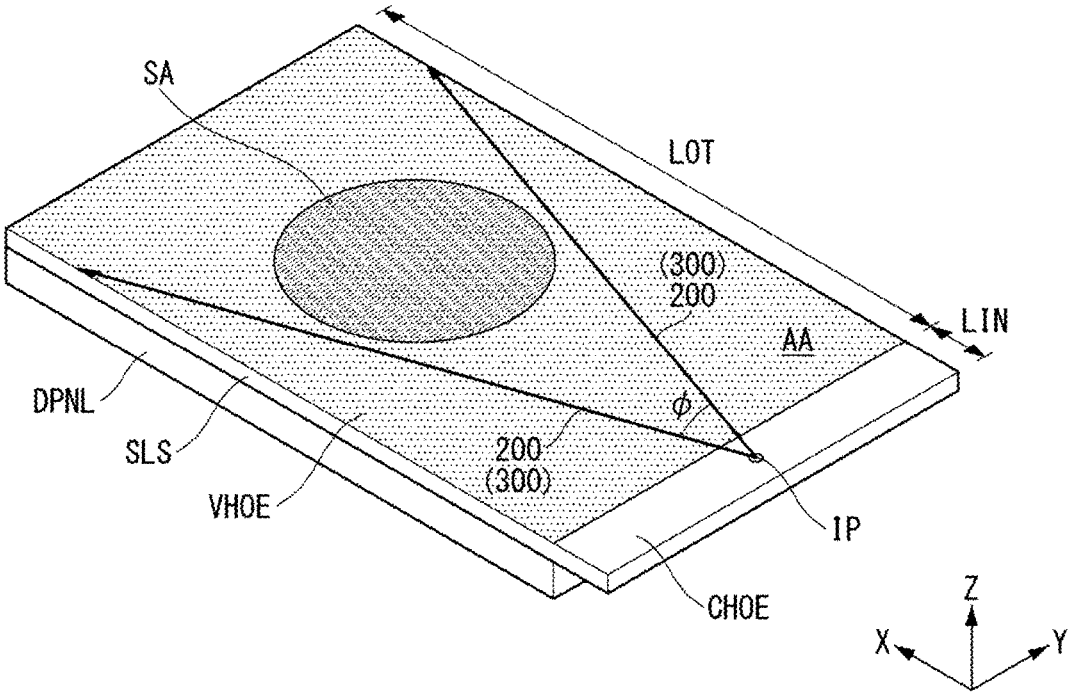
FIG. 4 illustrates a fingerprint sensing region according to an embodiment of the disclosure.

As shown in FIG. 3, the display panel DPNL may be disposed below the directional light source device SLS. The fingerprint sensor ISS may be obliquely attached to a rear surface of the display panel DPNL at a predetermined angle. The predetermined angle can be appropriately set in consideration of the arrangement state of peripheral components. The fingerprint sensor ISS converts light incident through the display panel DPNL into an electrical signal and outputs a fingerprint pattern image to the transparent substrate CP. A pixel array of the fingerprint sensor ISS includes photo sensor pixels. The photo sensor pixels include light detecting elements such as photodiodes or phototransistors. The fingerprint sensor ISS may be attached to the display panel DPNL using an adhesive such as an optical clear adhesive (OCA), a pressure sensitive adhesive (PSA), etc. However, embodiments are not limited thereto.

The incident light 100 is converted into the traveling light 200 by the light entering element CHOE. The traveling light 200 is converted in such a way that it has the diffusion angle φ on the XY plane which is the horizontal plane including an X-axis of the longitudinal direction axis and a Y-axis of the width direction axis. The traveling light 200 also maintains an originally collimated state (in which the incident light 100 has been collimated) on the XZ plane which is the vertical plane including the X-axis of the longitudinal direction axis and a Z-axis of the thickness direction axis.

In one embodiment, the diffusion angle φ is equal to or greater than an interior angle between two line segments connecting the incident point IP to two end points on the other side of the transparent substrate CP opposite the light entering element CHOE. In this instance, the traveling light 200 propagates within the transparent substrate CP while being diffused in a triangular shape having the diffusion angle φ. The outgoing light 300 is also provided within the same range as the traveling light 200. As a result, a fingerprint sensing region SA may be selected within a triangle area that widens from the incident point IP with the diffusion angle φ A circular hatched portion of FIG. 4 may be designated as the fingerprint sensing region SA. However, embodiments are not limited thereto.

When the fingerprint sensing region SA is formed in a center portion of the display panel DPNL or in a portion of an upper side of the display panel DPNL opposite the light entering element CHOE, it is preferable, but not required, that an amount of the outgoing light 300 has a maximum value in the fingerprint sensing region SA. To this end, the light efficiency of the light exiting element VHOE may be designed as a function of position so that it has a maximum value in a portion corresponding to the fingerprint sensing region SA and has a minimum value or a value close to zero in the other portions.

When the fingerprint IM touches the transparent substrate CP, light is reflected from the front surface of the transparent substrate CP at a location of valleys V of the fingerprint IM, passes through the light exiting element VHOE and the low refractive index layer LR, and travels toward the display panel DPNL. Therefore, the light can reach the fingerprint sensor ISS. On the other hand, because light 500 at ridges R of the fingerprint IM touching the transparent substrate CP propagates to the outside through the human skin, the light cannot reach the fingerprint sensor ISS.

The fingerprint sensor ISS converts light reflected from the fingerprint IM into an electrical signal and detects a fingerprint pattern. The fingerprint sensor ISS amplifies a voltage output from each photo sensor pixel and converts the amplified voltage into digital data. The fingerprint sensor ISS may convert the ridges R of the fingerprint IM into data of a white gray level and convert the valleys V of the fingerprint IM into data of a black gray level. On the contrary, the fingerprint sensor ISS may convert the ridges R of the fingerprint IM into data of a black gray level and convert the valleys V of the fingerprint IM into data of a white gray level. A fingerprint recognition processor (not shown) executes a predetermined fingerprint authentication algorithm and compares fingerprint pattern data detected in real time by the fingerprint sensor ISS with a user fingerprint pattern previously stored, thereby authenticating a fingerprint.

The fingerprint sensor ISS is disposed so that a light receiving surface of the fingerprint sensor ISS is directed toward the fingerprint sensing region SA. The display device according to the embodiment of the disclosure can display an image indicating a location of the fingerprint sensing region SA on the screen AA, so that the user can easily know the location of the fingerprint sensing region SA when the fingerprint recognition is required.

The light exiting element VHOE and the low refractive index layer LR are disposed on the display panel DPNL. The low refractive index layer LR may be attached to the display panel DPNL using an optical clear adhesive. The photo sensor pixels of the fingerprint sensor ISS are positioned opposite the transparent substrate CP, the light exiting element VHOE, and the low refractive index layer LR of the directional light source device SLS.

Figure 6:
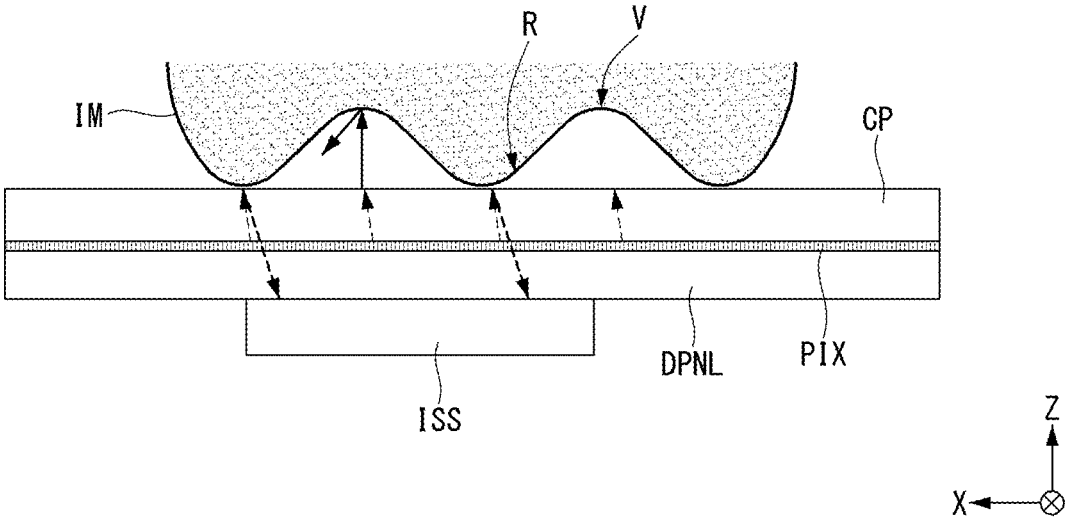
FIG. 6 is a cross-sectional view illustrating an example where pixels of a display panel operate as a fingerprint recognition light source according to an embodiment of the disclosure.

As shown in FIG. 6, an embodiment of the disclosure may use pixels of the display panel DPNL as fingerprint sensing light sources. An embodiment of the disclosure may implement a fingerprint sensor integrated with the display panel DPNL without the above-described directional light source device SLS.

Referring to FIG. 6, a front surface of the display panel DPNL may be covered with the transparent substrate CP. A fingerprint of the user may touch the transparent substrate CP on the screen AA of the display panel DPNL.

A pixel array of the display panel DPNL includes a plurality of data lines, a plurality of gate lines intersecting the data lines, and display pixels PIX arranged in a matrix. Each display pixel PIX may include a red subpixel, a green subpixel, and a blue subpixel for color implementation. Each display pixel PIX may further include a white subpixel. Each subpixel may include a light emitting element such as an organic light emitting diode (OLED).

The fingerprint sensor ISS is attached to the rear surface of the display panel DPNL at a location overlapping the fingerprint sensing region SA, so that the fingerprint sensor ISS is opposite to the fingerprint sensing region SA on the screen AA of the display panel DPNL. A foam pad and a metal layer may be attached to the rear surface of the display panel DPNL. In order to increase light receiving efficiency of the fingerprint sensor ISS and reduce a thickness of the display device, the fingerprint sensor ISS may be directly attached to the rear surface of the display panel DPNL exposed by a hole of the foam pad and the metal layer.

When an event requiring fingerprint recognition occurs, the pixels PIX of the fingerprint sensing region SA emit light. Light from the pixels PIX is reflected from the ridges R of the fingerprint IM touching the transparent substrate CP and is received by the photo sensor pixels of the fingerprint sensor ISS. On the other hand, the light from the pixels PIX passes through the valleys V of the fingerprint IM and is hardly reflected. Each photo sensor pixel of the fingerprint sensor ISS converts light reflected from the valley V of the fingerprint IM into a voltage using a photo sensor converting light into an electrical signal, amplifies the voltage, and converts the amplified voltage into digital data. A fingerprint recognition processor executes a predetermined fingerprint authentication algorithm and compares fingerprint pattern data detected in real time by the fingerprint sensor ISS with a user fingerprint pattern previously stored, thereby authenticating a fingerprint.

Figure 5:
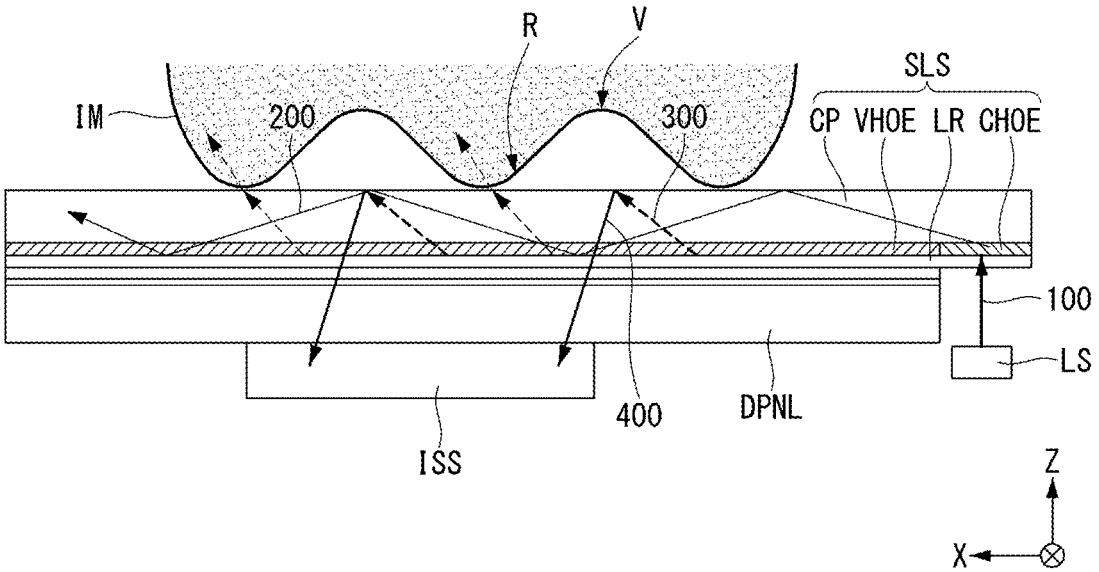
FIG. 5 is a cross-sectional view illustrating a fingerprint sensor attached to a display panel according to an embodiment of the disclosure.
Figure 7:
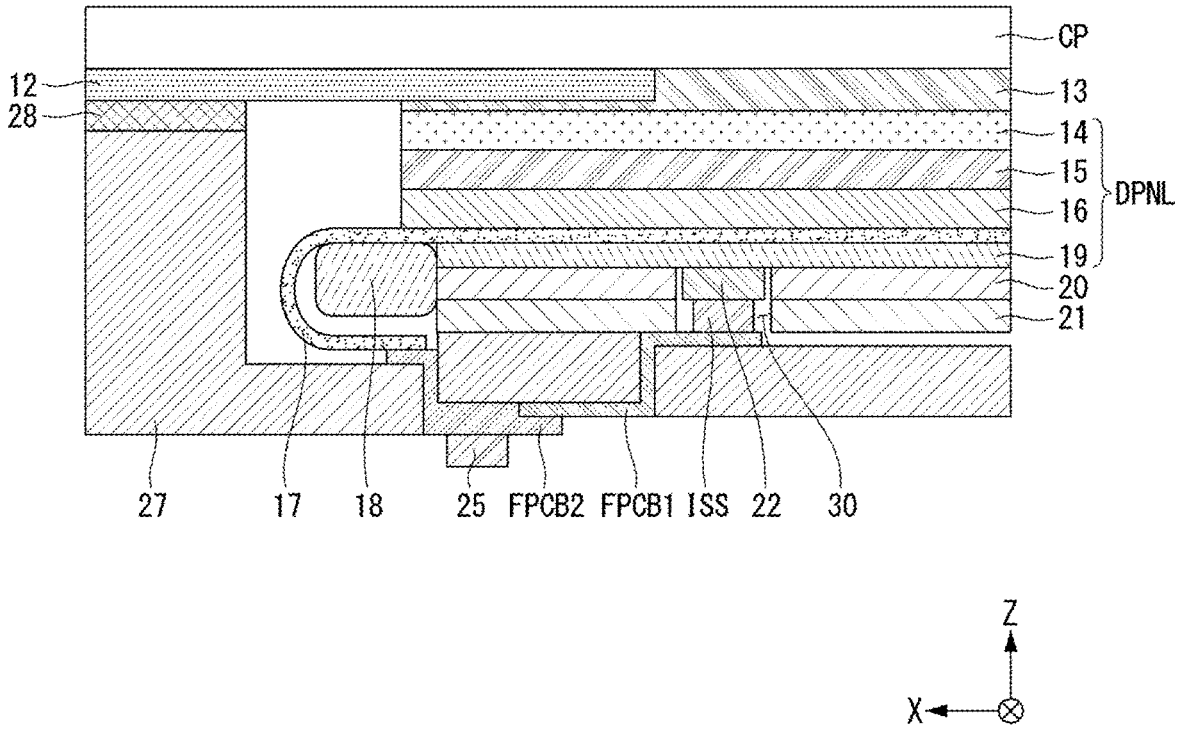
FIGS. 7 and 8 are cross-sectional views illustrating an example where a display panel and a fingerprint sensor according to an embodiment of the disclosure are applied to a mobile information terminal according to an embodiment of the disclosure.
Figure 8:
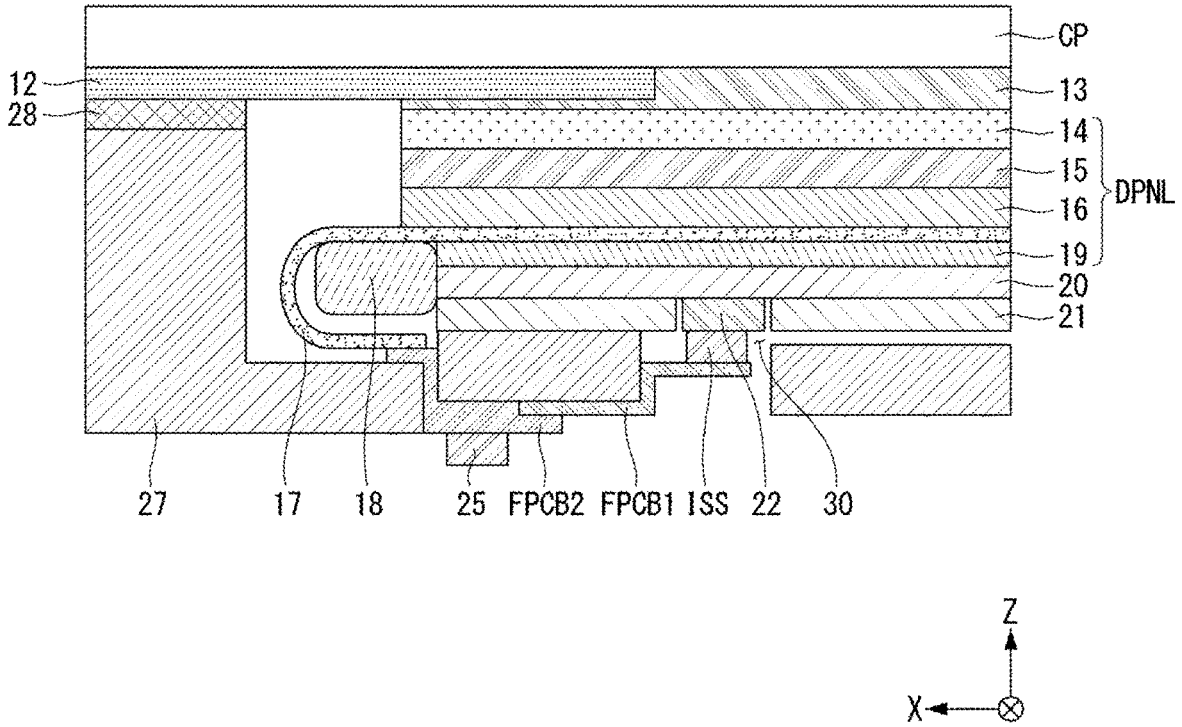

The display panel DPNL and the fingerprint sensor ISS shown in FIGS. 5 and 6 may have a structure shown in FIG. 7 or 8 in a mobile information terminal.

Referring to FIG. 7, a mobile information terminal according to an embodiment of the disclosure includes a display panel DPNL displaying an image on a screen AA, a fingerprint sensor ISS attached to the display panel DPNL, and a driver integrated circuit (IC) 25 driving the display panel DPNL. A transparent substrate CP is disposed on the display panel DPNL.

A fingerprint of the user may touch a front surface of the transparent substrate CP. The fingerprint sensor ISS is coupled to the display panel DPNL to sense light reflected from the fingerprint on a display area of the display panel DPNL. The light reflected from the fingerprint is incident on the fingerprint sensor ISS through the display panel DPNL. The fingerprint sensor ISS is disposed opposite a fingerprint touch surface (i.e., the front surface of the transparent substrate CP) with the display panel DPNL interposed between the fingerprint sensor ISS and the fingerprint touch surface. The fingerprint sensor ISS detects light reflected from the user's fingerprint and outputs a fingerprint pattern image. Thus, a fingerprint touch operation and a fingerprint pattern detecting operation are performed at opposite sides of the display panel DPNL.

The display panel DPNL may be a flexible display panel of a flexible display device such as a plastic OLED display. However, embodiments are not limited thereto. In case of the plastic OLED display, the display panel DPNL includes a back plate 19, an organic thin film 17 attached to the back plate 19, a display area 16 formed on the organic thin film 17, a touch sensor array 15 disposed on the display area 16, and a polarizing film 14 attached to the touch sensor array 15. The display area 16 includes a pixel array displaying an image.

The polarizing film 14 blocks external light from being reflected at the display panel DPNL and improves outdoor visibility. The polarizing film 14 may include a circular polarizer (or a $\lambda/4$ plate). The polarizing film 14 is attached to the transparent substrate CP by an adhesive 13, for example, an optical clear adhesive (OCA).

The back plate 19 may be a polyethylene terephthalate (PET) substrate. However, embodiments are not limited thereto. The back plate 19 prevents the display area 16 from being exposed to moisture or humidity and supports the display area 16. The organic thin film 17 may be a thin polyimide (PI) film substrate. A multi-layered buffer layer (not shown) made of an insulating material may be formed on the organic thin film 17. A plurality of lines for supplying electric power or signals to the display area 16 and the touch sensor array 15 may be formed on the organic thin film 17.

The display area 16 includes data lines, gate lines intersecting the data lines, and pixels arranged in a matrix. The display area 16 is a screen displaying an input image. Each pixel includes a light emitting element. For example, each pixel may include an OLED and a driving circuit of the OLED. The data lines of the display area 16 are connected to the driver IC 25 and receive a data signal from the driver IC 25. The touch sensor array 15 is driven by a touch sensor driver to sense a touch input. The touch sensor array 15 transmits coordinates and an identification (ID) code of each touch input to a host system.

The fingerprint sensor ISS is mounted on a first flexible circuit board FPCB1. Because the fingerprint sensor ISS is disposed below the display area 16, the fingerprint sensor ISS does not affect a size of a bezel of the display device without change in a structure of the display panel DPNL and can sense a fingerprint pattern. Each of first and second flexible circuit boards FPCB1 and FPCB2 may be selected from among a flexible printed circuit board (FPCB), a flexible flat cable (FFC), and a flexible printed circuit (FPC).

The driver IC 25 may be mounted on the second flexible circuit board FPCB2. The driver IC 25 in the mobile information terminal includes a data driver for supplying a data signal to the data lines of the display panel DPNL, a gate driver for supplying a gate signal (or referred to as "scan signal") to the gate lines (or referred to as "scan lines") of the display panel DPNL, and a timing controller for controlling operation timings of the data driver and the gate driver. The driver IC 25 writes data of an input image received from the host system to the pixels of the display panel DPNL. The host system is connected to the fingerprint sensor ISS via the first flexible circuit board FPCB1 and is connected to a display panel driving circuit via the second flexible circuit board FPCB2. The host system may be an application processor (AP) in the mobile information terminal. However, embodiments are not limited thereto.

A foam pad 20 and a metal layer 21 may be laminated on the back plate 19 of the display panel DPNL. The foam pad 20 may be made of a foamed resin and absorbs a vibration or an impact. The metal layer 21 may be made of metal, for example, copper (Cu) shielding electromagnetic interference (EMI).

Each of the foam pad 20 and the metal layer 21 has a hole 30 exposing the back plate 19 so that the fingerprint sensor ISS is attached to the back plate 19. The fingerprint sensor ISS is disposed in the hole 30. A light receiving portion of the fingerprint sensor module is bonded to the back plate 19 with an adhesive 22. The adhesive 22 may be an optical clear adhesive (OCA), a pressure sensitive adhesive (PSA), etc. A mid-frame 27 may have a hole for exposing the hole into which the fingerprint sensor ISS is inserted.

Because the fingerprint sensor ISS is embedded in the hole of the foam pad 20 and the metal layer 21, a distance between a fingerprint on the transparent substrate CP and the fingerprint sensor ISS can decrease. A structure in which the fingerprint sensor ISS is embedded can increase light receiving efficiency of the fingerprint sensor ISS and improve a fingerprint sensing performance.

The mid-frame 27 accommodates the display panel DPNL, the fingerprint sensor ISS, the driver IC 25, and the like. An upper sidewall of the mid-frame 27 may be attached to the transparent substrate CP using a double-sided tape 28. A deco film 12 may be attached to the transparent substrate CP. Pictures, characters, etc. may be printed on the deco film 12. One side of the organic thin film 17 is bent to a rear surface of the display panel DPNL and is connected to one end of the second flexible circuit board FPCB2. A mandrel 18 is attached to the side of the back plate 19 and the side of the foam pad 20 and supports a bending portion of the organic thin film 17.

The display panel DPNL may be implemented as an OLED display panel disposed on a glass substrate. In this instance, the back plate 19 and the organic thin film 17 may be replaced by a single glass substrate.

Configuration of FIG. 8 is substantially the same as configuration of FIG. 7, except that the fingerprint sensor ISS is attached to the foam pad 20. In the configuration of FIG. 8, a hole, into which the fingerprint sensor ISS is inserted, is provided for the metal layer 21, but is not provided for the foam pad 20. The foam pad 20 may be formed of a material with high transparency, so that the foam pad 20 does not absorb light received by the fingerprint sensor ISS.

Figure 9A:
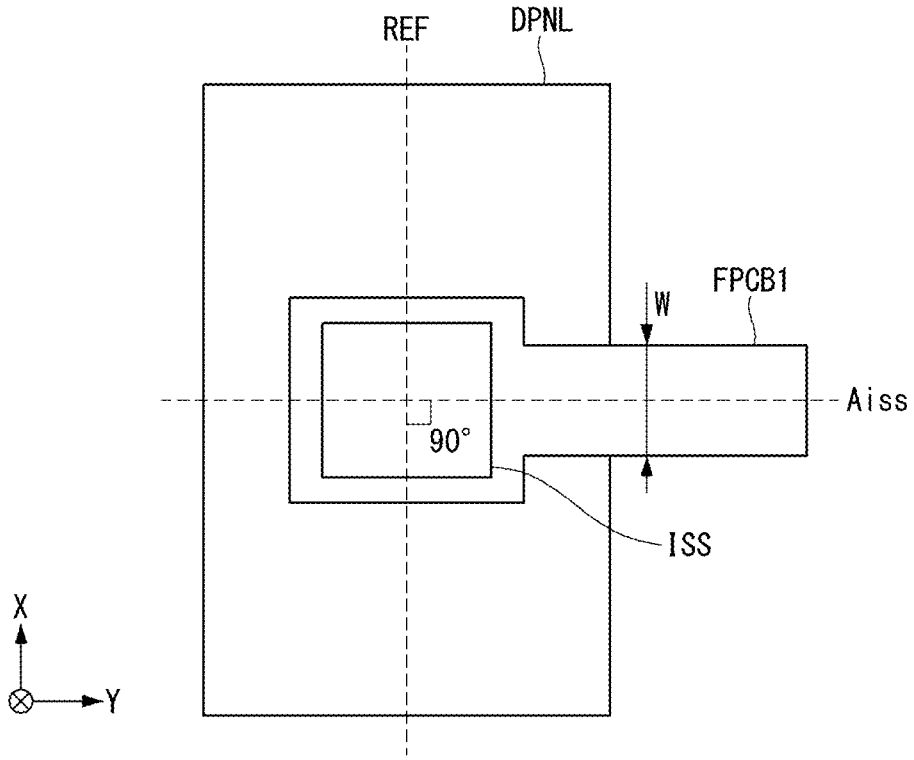
FIG. 9A illustrates an example where an attachment angle of a fingerprint sensor to a display panel is 90°.
Figure 9B:
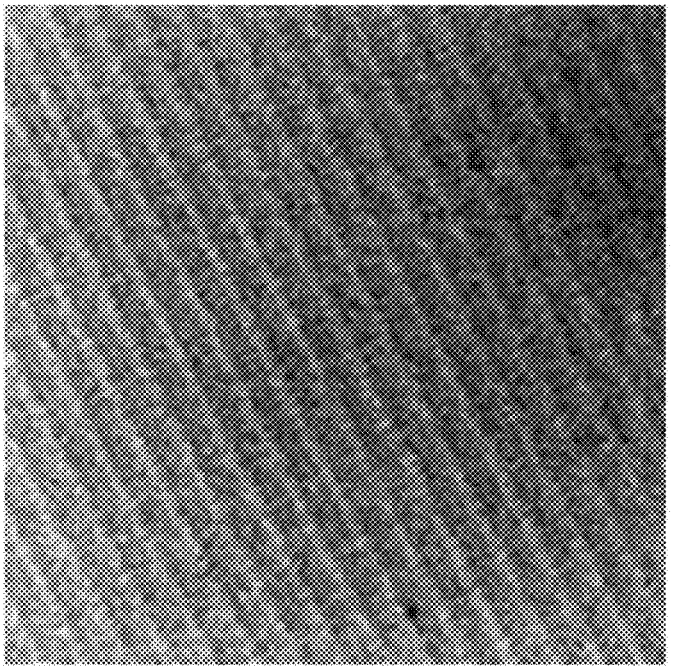
FIG. 9B illustrates moire interference seen on an output image of a fingerprint sensor when an attachment angle is 90°.

A pixel array of the display panel DPNL and a pixel array of the fingerprint sensor ISS each includes a plurality of lines spaced at regular intervals. Thus, when the display panel DPNL and the fingerprint sensor ISS overlap each other, moire interference may be seen due to an overlap of periodic patterns. For example, when the fingerprint sensor ISS is attached to the display panel DPNL at 90° as shown in FIG. 9A, moire interference, which is not seen when there is only the fingerprint sensor ISS, may be seen in a stripe form due to interference between the fingerprint sensor ISS and the display panel DPNL as shown in FIG. 9B. When moire interference, shown in FIG. 9B, is overlaid on a fingerprint pattern image output from the fingerprint sensor ISS, it is difficult to identify a fingerprint pattern. This leads to a reduction in a fingerprint recognition rate.

In FIG. 9A, "REF" is an imaginary attachment reference line parallel to a long axis X of the display panel DPNL. "Aiss" is an imaginary sensor attachment direction line that passes through a center of the fingerprint sensor ISS and a center of a direction of a width W of the first flexible circuit board FPCB1 and intersects the imaginary attachment reference line REF. Terminals at one side of the first flexible circuit board FPCB1 are connected to terminals of the fingerprint sensor ISS, and terminals at other side of the first flexible circuit board FPCB1 are connected to terminals of the host system (not shown). The fingerprint sensor ISS is connected to the host system via the first flexible circuit board FPCB1. The first flexible circuit board FPCB1, that may be selected from among a flexible printed circuit board (FPCB), a flexible flat cable (FFC), and a flexible printed circuit (FPC) as described above, is a circuit component electrically connecting the fingerprint sensor ISS to the host system. In embodiments disclosed herein, the first flexible circuit board FPCB1 is denoted as reference numeral "FPCB", but is not limited to a flexible printed circuit board FPCB.

Embodiments of the disclosure prevent moire interference by setting an attachment angle of the fingerprint sensor ISS to the display panel DPNL at a predetermined angle. For example, the predetermined angle may be set about 20° to 45° to a reference line REF parallel to a long axis of the display panel DPNL. The attachment angle indicates an angle of the fingerprint sensor ISS to the display panel DPNL when the display panel DPNL is disposed at 0° (i.e., when the attachment reference line REF is not inclined and is positioned at 0°). For example, when the attachment reference line REF and the sensor attachment direction line Aiss coincide with each other, the attachment angle is 0°. Namely, the attachment angle may be measured as an angle between the attachment reference line REF and the sensor attachment direction line Aiss.

Figure 10A:
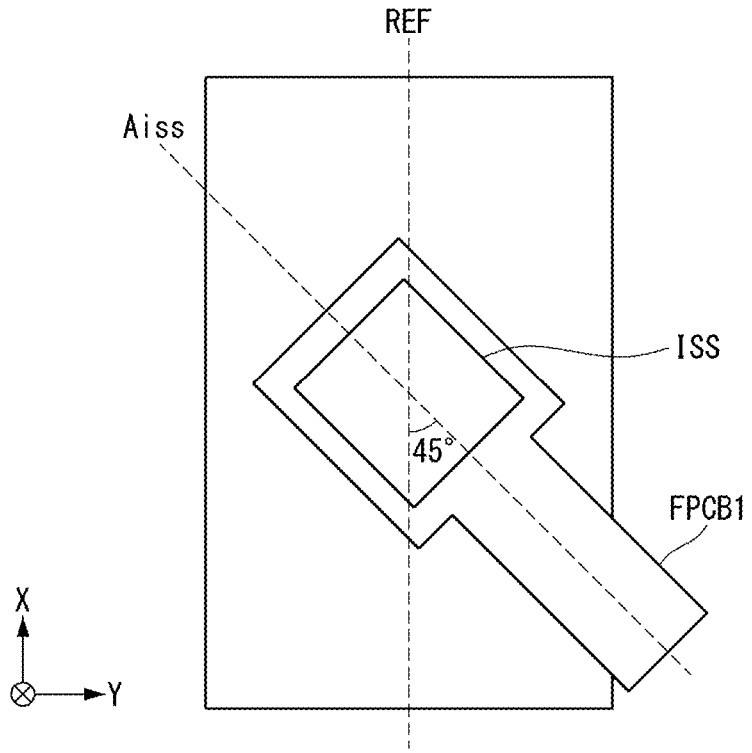
FIG. 10A illustrates an example where an attachment angle of a fingerprint sensor to a display panel is 45° according to an embodiment of the disclosure.
Figure 10B:
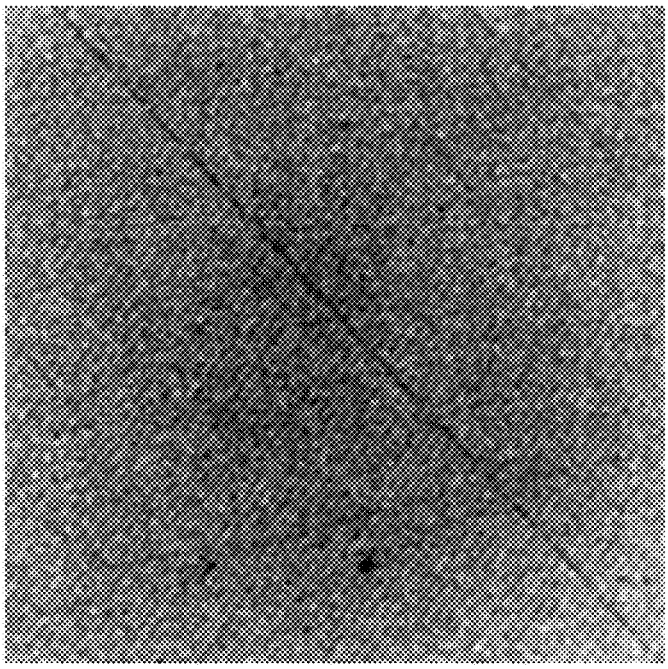
FIG. 10B illustrates an output image of a fingerprint sensor when an attachment angle is 45°.
Figure 11A:
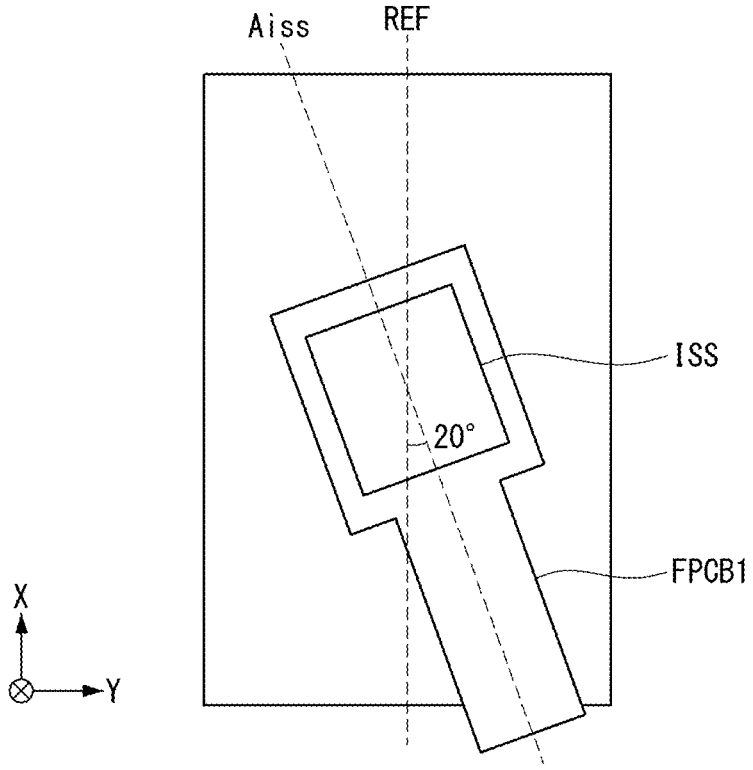
FIG. 11A illustrates an example where an attachment angle of a fingerprint sensor to a display panel is 20° according to an embodiment of the disclosure.
Figure 11B:
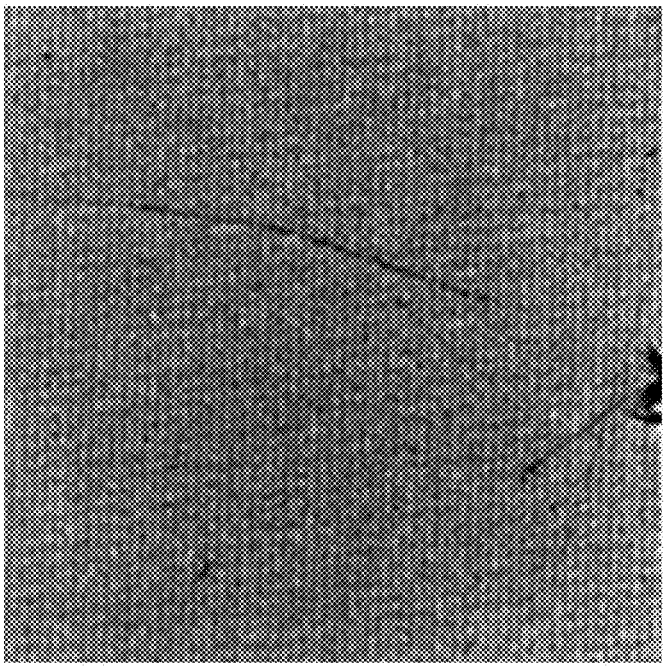
FIG. 11B illustrates a photographed image of moire interference seen when an attachment angle is 20°.

FIG. 10A illustrates an example where an attachment angle of the fingerprint sensor ISS to the display panel DPNL is 45°. FIG. 10B illustrates an output image of the fingerprint sensor ISS when an attachment angle is 45°. FIG. 11A illustrates an example where an attachment angle of the fingerprint sensor ISS to the display panel DPNL is 20°. FIG. 11B illustrates an output image of the fingerprint sensor ISS when an attachment angle is 20°.

Referring to FIGS. 10A to 11B, when an attachment angle of the fingerprint sensor ISS to the display panel DPNL is 25° to 45°, an image without moire interference can be obtained from the fingerprint sensor ISS. When the attachment angle of the fingerprint sensor ISS to the display panel DPNL is 45°, a clear image without moire interference can be obtained.

A length of a short direction Y occupied by the fingerprint sensor ISS and the first flexible circuit board FPCB1 at the attachment angle of 45° is longer than that at the attachment angle of 20°. Thus, in case of the mobile information terminal that needs to reduce a length of the display panel DPNL in the short direction Y, the attachment angle of the fingerprint sensor ISS to the display panel DPNL may decrease to 20° or an angle close to 20°.

Figure 12:
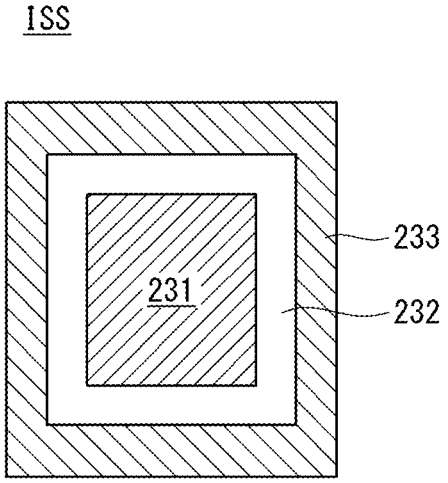
FIG. 12 is a plan view schematically illustrating a structure of a fingerprint sensor according to an embodiment of the disclosure.
Figure 13A:
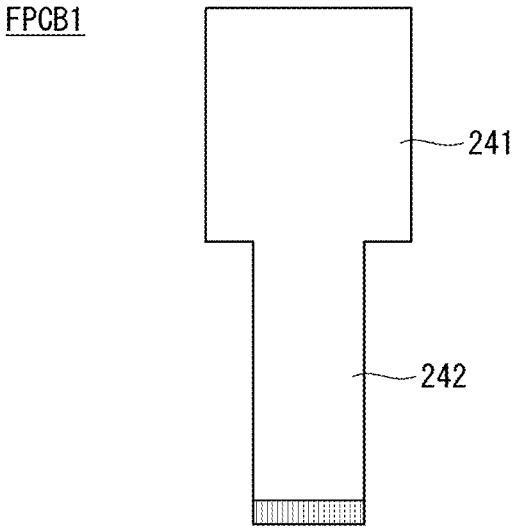
FIGS. 13A and 13B are plan views illustrating a structure of a first flexible circuit board according to an embodiment of the disclosure.
Figure 13B:
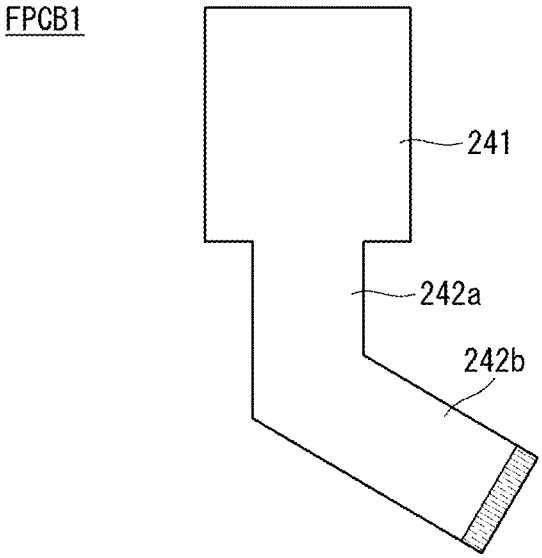

FIG. 12 is a plan view schematically illustrating a structure of the fingerprint sensor ISS. FIGS. 13A and 13B are plan views illustrating a structure of the first flexible circuit board FPCB1.

Referring to FIGS. 12 to 13B, the fingerprint sensor ISS includes a semiconductor die 232 on which a photo sensor pixel array 231 is formed, and a mold 233 sealing the semiconductor die 232. The fingerprint sensor ISS may be implemented as a sensor package. Metal lines are arranged on the semiconductor die 232 to connect the photo sensor pixel array 231 to terminals of the first flexible circuit board FPCB1.

Figure 14:
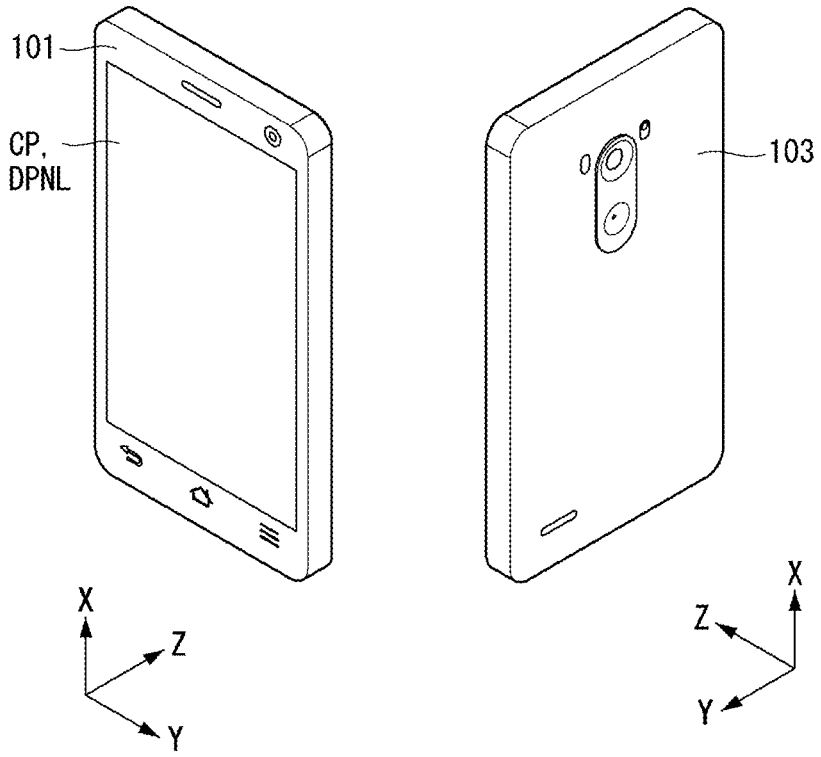
FIGS. 14 and 15 schematically illustrate a mobile information terminal according to an embodiment of the disclosure according to an embodiment of the disclosure.
Figure 15:
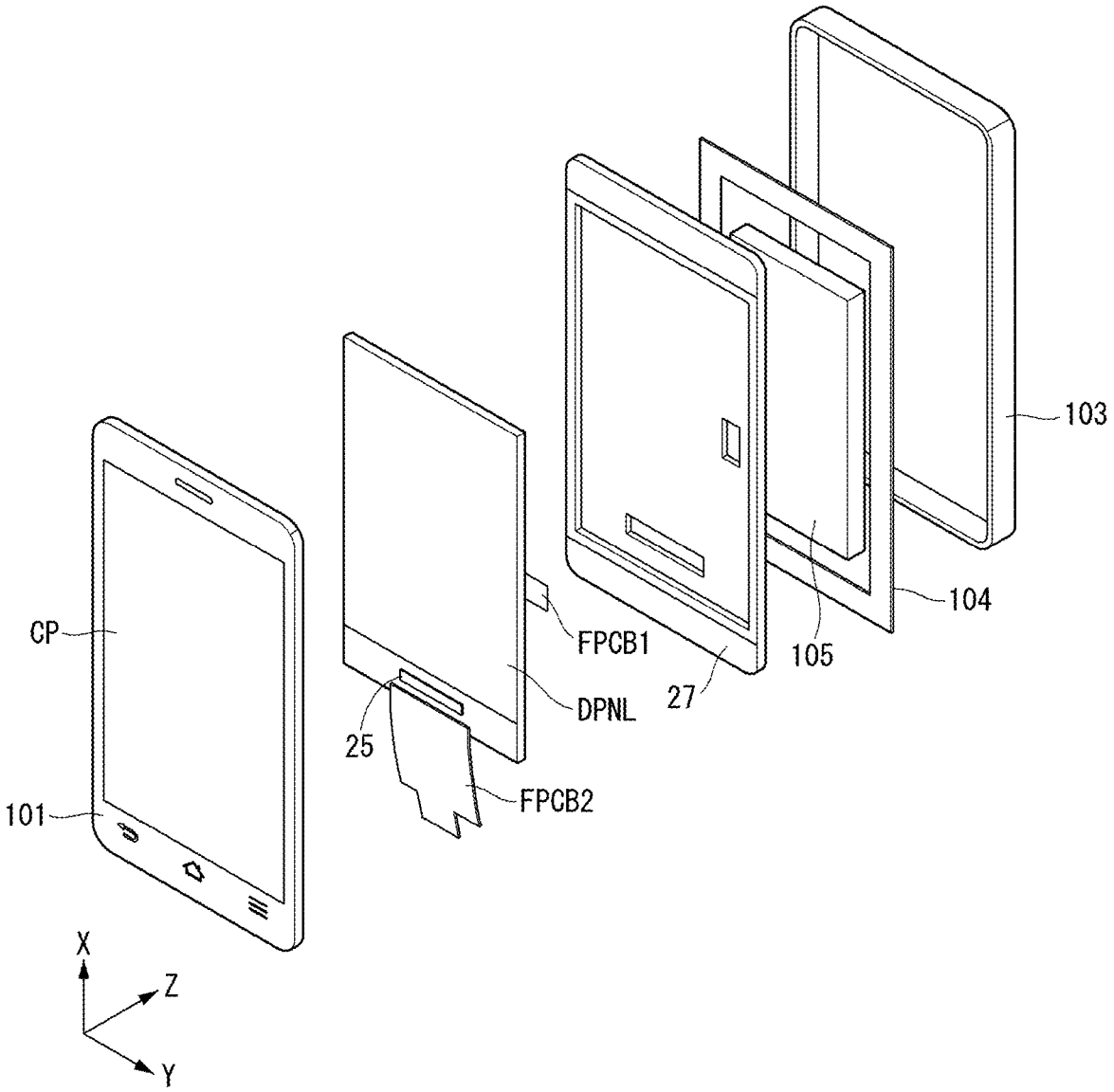
Figure 19A:
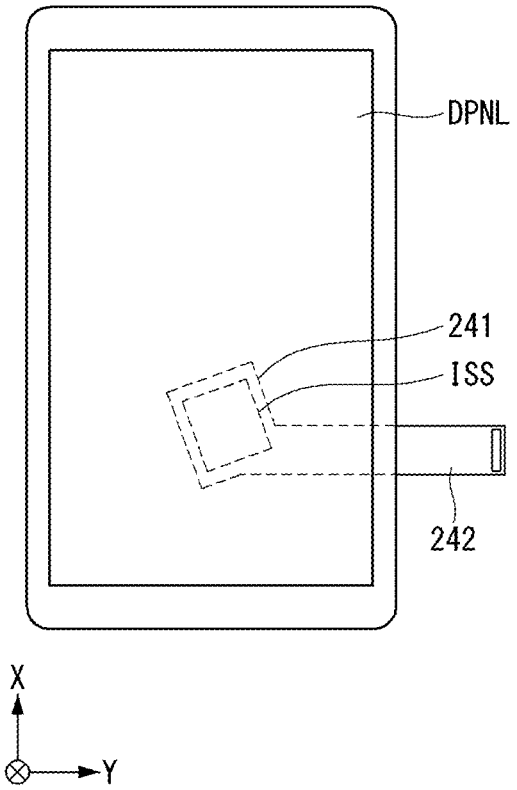
Figure 19B:
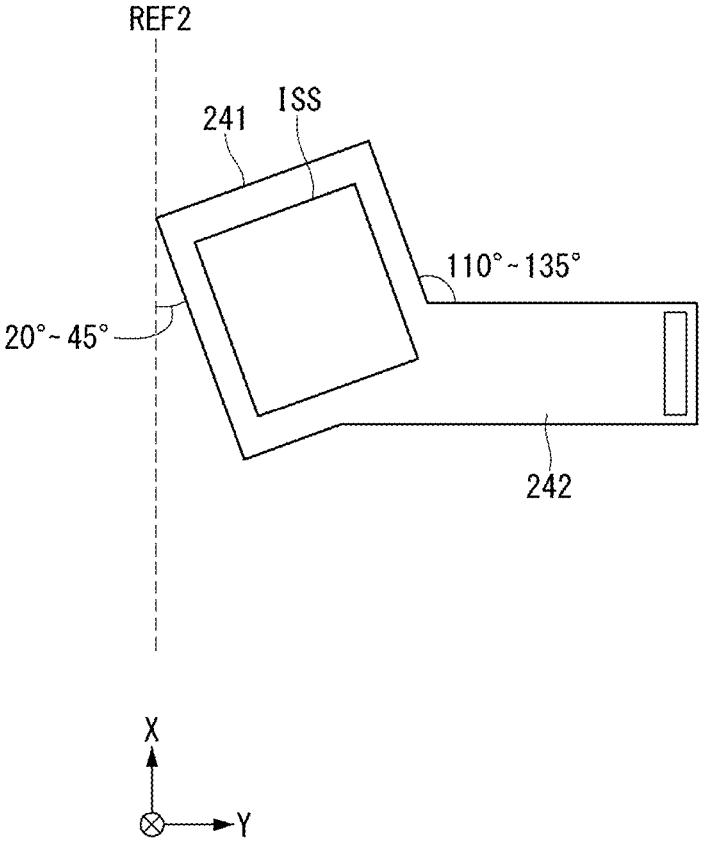

The first flexible circuit board FPCB1 includes a sensor mounting portion 241 on which the fingerprint sensor ISS is mounted, and a tail portion 242 connecting the sensor mounting portion 241 to a main board shown in FIGS. 14 and 15. The sensor mounting portion 241 may be formed in a rectangular shape, but is not limited thereto. A width of the tail portion 242 is less than a width of the sensor mounting portion 241. The tail portion 242 may be connected to one side of the sensor mounting portion 241, or may be connected to two sides of the sensor mounting portion 241 as shown in FIGS. 19A and 19B. The sensor mounting portion 241 and the tail portion 242 each includes lines connecting the fingerprint sensor ISS to the main board. The tail portion 242 includes terminals connected to a connector of the main board at an end of the tail portion 242.

The tail portion 242 may be formed in a straight line shape as shown in FIG. 13A, or may be formed in a shape bent at a predetermined angle as shown in FIG. 13B. When the tail portion 242 is bent at a predetermined angle, the tail portion 242 includes a first tail portion 242a positioned close to the sensor mounting portion 241 and a second tail portion 242b that is bent from the first tail portion 242a at a predetermined angle and is connected to the main board. The tail portion 242 may include N (N is a positive integer equal to or greater than 2) pieces of sub tail portions, which are connected to each other at an arbitrary predetermined angle so as to be bent in various shapes in consideration of the arrangement of peripheral components.

FIGS. 14 and 15 schematically illustrate a mobile information terminal according to an embodiment of the disclosure. More specifically, FIGS. 14 and 15 illustrate a mobile information terminal of a full touch screen structure, by way of example. However, embodiments are not limited thereto.

Referring to FIGS. 14 and 15, a mobile information terminal according to an embodiment of the disclosure includes a display panel DPNL, a front cover 101, a back cover 103, a mid-frame 27, a main board 104, a battery 105, and the like. In embodiments disclosed herein, "cover" may be represented as a case and a housing.

A front surface of the display panel DPNL may be covered with a transparent substrate CP. The transparent substrate CP may be implemented as a tempered glass. The front cover 101 covers an edge of the display panel DPNL and an edge of the transparent substrate CP. A front camera and various sensors may be disposed on a front surface of the mobile information terminal. A rear camera and various sensors may be disposed on a rear surface of the mobile information terminal. The sensors include various sensors applicable to the mobile information terminal, for example, a proximity sensor, a gyroscope sensor, a magnetic sensor, a motion sensor, an illumination sensor, an RGB sensor, a hall sensor, a temperature/humidity sensor, a heart rate sensor, a fingerprint scan sensor, and the like.

An audio video (AV) input unit, a user input unit, a speaker, a microphone, etc. are installed on the front cover 101 and the back cover 103. The AV input unit, the user input unit, the speaker, and the microphone are connected to the main board 104.

The display panel DPNL, the mid-frame 27, the main board 104, the battery 105, etc. are disposed between the front cover 101 and the back cover 103. The mid-frame 27 supports the display panel DPNL and spatially separates the display panel DPNL and the main board 104. A driver IC 25 for driving the display panel DPNL is connected to a second flexible circuit board FPCB2. A fingerprint sensor ISS and a first flexible circuit board FPCB1 are disposed on a rear surface of the display panel DPNL. The first and second flexible circuit boards FPCB1 and FPCB2 are connected to the main board 104.

The main board 104 is connected to the driver IC 25 and the fingerprint sensor ISS through the first and second flexible circuit boards FPCB1 and FPCB2. Although not shown, the main board 104 may include a wireless communication module, a short-range communication module, a mobile communication module, a broadcast receiving module, an AV input unit, a global position system (GPS) module, a power circuit, and the like. The user input unit, the speaker, the microphone, the battery 105, etc. are connected to the main board 104. The power circuit removes a noise from a voltage of the battery 105 and properly adjusts the voltage of the battery 105 to generate driving power for circuits on the main board 104, the driver IC 25, and the fingerprint sensor ISS. In the mobile information terminal, the main board 104 includes a host system that is an application processor (AP). The application processor may transmit image data to the driver IC 25 via a mobile industry processor interface (MIPI).

Figure 16:
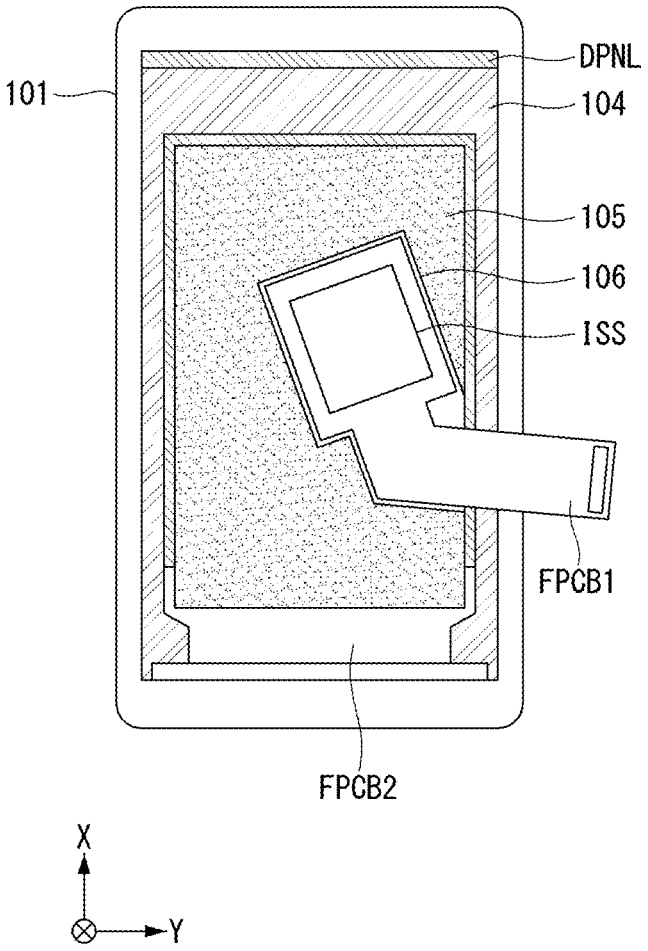
FIG. 16 is a plan view of a mobile information terminal when viewed from a rear surface of the mobile information terminal in a state where a back cover of the mobile information terminal is detached according to an embodiment of the disclosure.
Figure 17:
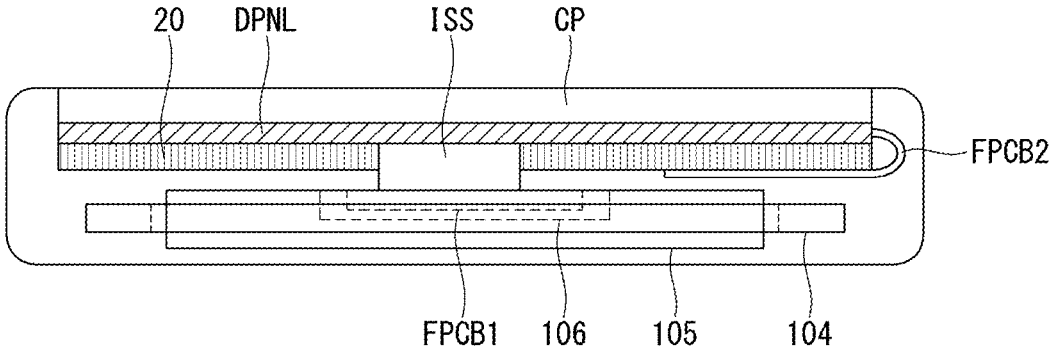
FIG. 17 is a cross-sectional view illustrating a structure of a mobile information terminal according to an embodiment of the disclosure according to an embodiment of the disclosure.

As shown in FIGS. 15 and 16, the main board 104 may be formed on a film substrate not overlapping the battery 105, but is not limited thereto. In order to reduce a thickness of the mobile information terminal, as shown in FIGS. 16 and 17, the battery 105 may have a groove 106 accommodating at least a portion of the first flexible circuit board FPCB1 on which the fingerprint sensor ISS is mounted.

FIGS. 18A to 21B illustrate various methods of disposing a fingerprint sensor and a first flexible circuit board according to an embodiment of the disclosure.

Figure 18A:
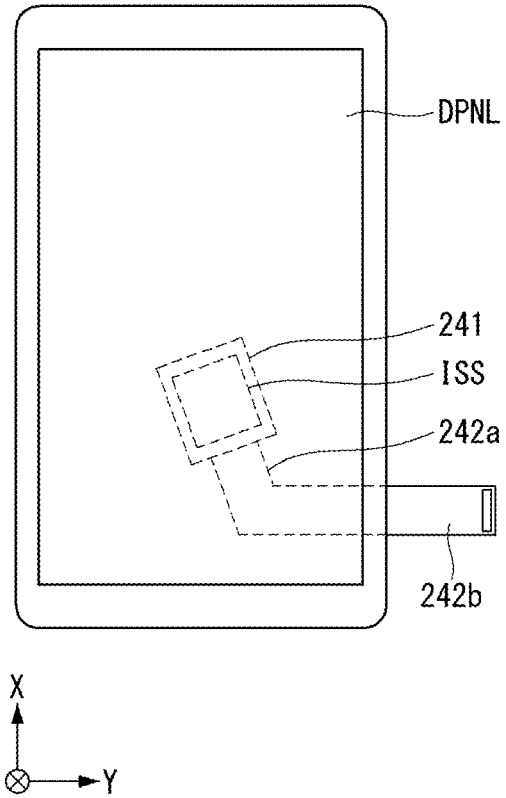
FIGS. 18A to 21B illustrate various methods of disposing a fingerprint sensor and a first flexible circuit board according to an embodiment of the disclosure.
Figure 18B:
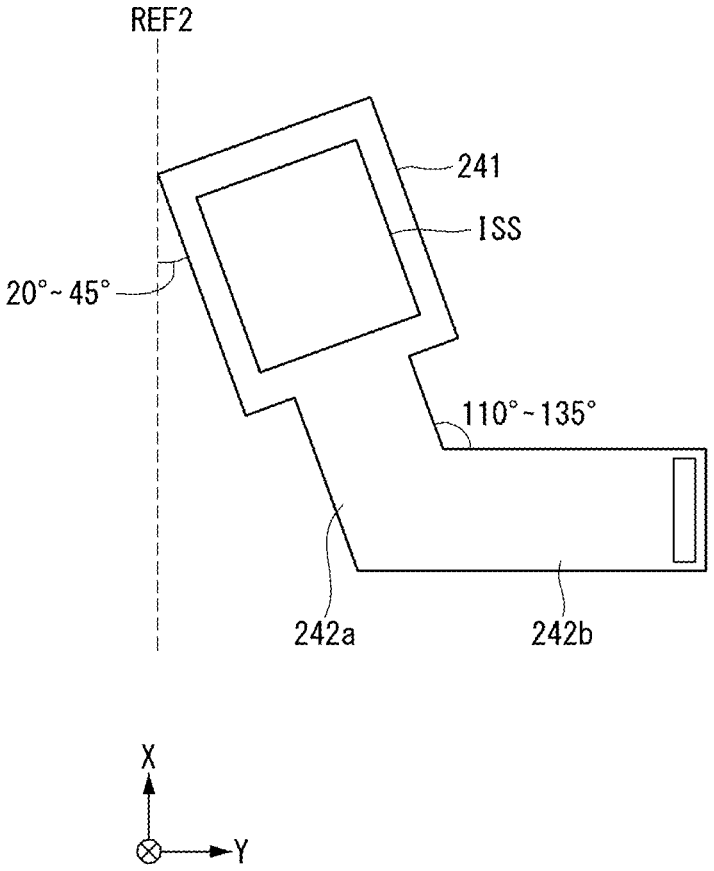

Referring to FIGS. 18A and 18B, an attachment angle of each of the fingerprint sensor ISS and a sensor mounting portion 241 of the first flexible circuit board FPCB1 may be 20° to 45°. In this instance, a second imaginary attachment reference line REF2 parallel to an imaginary attachment reference line REF is positioned at 0°, and the attachment angle of each of the fingerprint sensor ISS and the sensor mounting portion 241 of the first flexible circuit board FPCB1 with respect to the second attachment reference line REF2 is 20° to 45°. The second imaginary attachment reference line REF2 may be substantially the same as the above-described imaginary attachment reference line REF.

A tail portion 242 of the first flexible circuit board FPCB1 includes a first tail portion 242a, which is connected to the sensor mounting portion 241 and is extended from the sensor mounting portion 241 at an angle of 20° to 45° to the second attachment reference line REF2, and a second tail portion 242b which is bent from the first tail portion 242a at a minor angle of 110° to 135°. A direction of a long axis of the second tail portion 242b is a direction perpendicular (i.e., 90°) to the second attachment reference line REF2 when the second attachment reference line REF2 is positioned at 0°.

Referring to FIGS. 19A and 19B, an attachment angle of each of the fingerprint sensor ISS and a sensor mounting portion 241 of the first flexible circuit board FPCB1 may be 20° to 45°. In this instance, a second imaginary attachment reference line REF2 parallel to the imaginary attachment reference line REF is positioned at 0°, and the attachment angle of each of the fingerprint sensor ISS and the sensor mounting portion 241 of the first flexible circuit board FPCB1 with respect to the second attachment reference line REF2 is 20° to 45°.

A tail portion 242 of the first flexible circuit board FPCB1 is connected to the sensor mounting portion 241 and is bent from the sensor mounting portion 241 at a minor angle of 110° to 135°. A direction of a long axis of the second tail portion 242b is a direction perpendicular (i.e., 90°) to the second attachment reference line REF2 when the second attachment reference line REF2 is positioned at 0°.

Figure 20A:
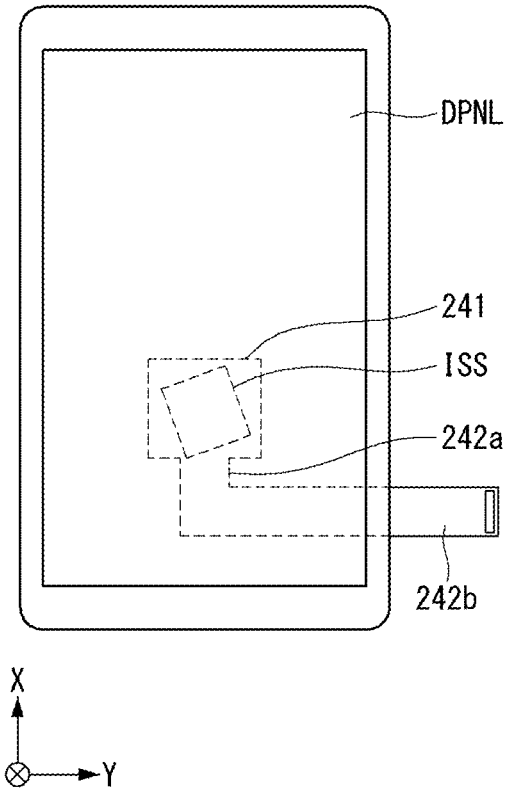
Figure 20B:
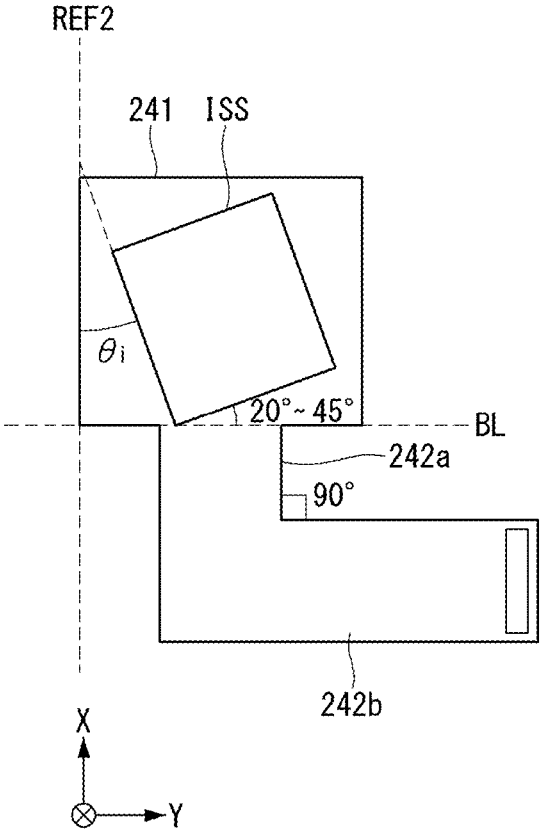

Referring to FIGS. 20A and 20B, an attachment angle 9, of the fingerprint sensor ISS may be 20° to 45°. An attachment angle of the sensor mounting portion 241 of the first flexible circuit board FPCB1 is 0° that is parallel to a second imaginary attachment reference line REF2. Thus, the attachment angle $\theta_i$ of the fingerprint sensor ISS may be 20° to 45° on the sensor mounting portion 241 of the first flexible circuit board FPCB1.

A tail portion 242 of the first flexible circuit board FPCB1 includes a first tail portion 242a, which is connected to the sensor mounting portion 241 and is disposed parallel to the second attachment reference line REF2, and a second tail portion 242b which is bent from the first tail portion 242a at a minor angle of 90°. A direction of a long axis of the second tail portion 242b is a direction perpendicular (i.e., 90°) to the second attachment reference line REF2. A boundary line BL between the sensor mounting portion 241 and the first tail portion 242a is an imaginary line perpendicular (i.e., 90°) to the second attachment reference line REF2. The fingerprint sensor ISS may be obliquely mounted on the sensor mounting portion 241 of the first flexible circuit board FPCB1 at an angle of 20° to 45° to the boundary line BL.

Figure 21A:
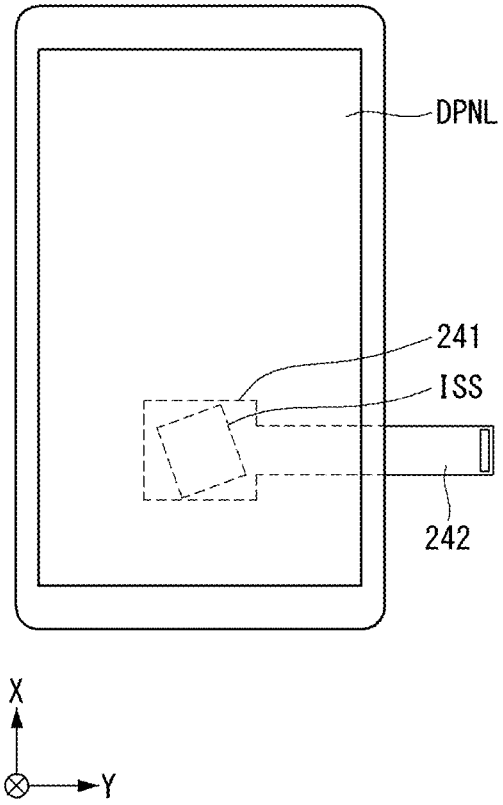
Figure 21B:
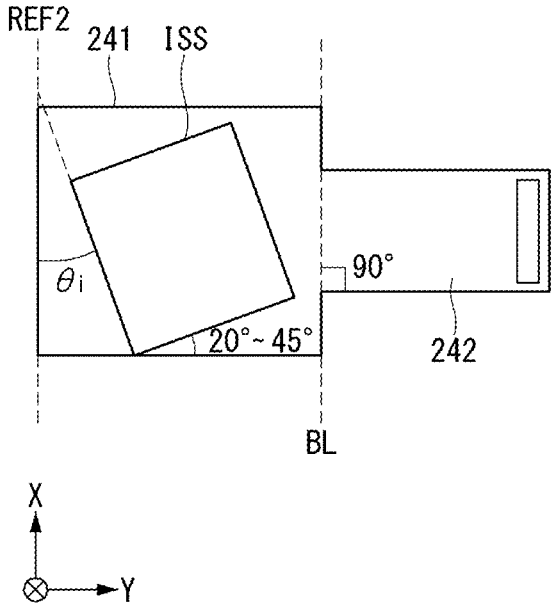

Referring to FIGS. 21A and 21B, an attachment angle $\theta_i$ of the fingerprint sensor ISS may be 20° to 45°. One side of the sensor mounting portion 241 of the first flexible circuit board FPCB1 is disposed at 0° that is parallel to a second imaginary attachment reference line REF2. Thus, the attachment angle $\theta_i$ of the fingerprint sensor ISS may be 20° to 45° on the sensor mounting portion 241 of the first flexible circuit board FPCB1.

A tail portion 242 of the first flexible circuit board FPCB1 is connected to the sensor mounting portion 241 and is extended at a right angle to the second attachment reference line REF2. A direction of a long axis of the tail portion 242 is a direction perpendicular (i.e., (90°) to the second attachment reference line REF2. A boundary line BL between the sensor mounting portion 241 and the tail portion 242 is an imaginary line parallel (i.e., (0°) to the second attachment reference line REF2.

The fingerprint sensor ISS may be obliquely mounted on the sensor mounting portion 241 at an angle of 20° to 45° to the sensor mounting portion 241.

Figure 22:
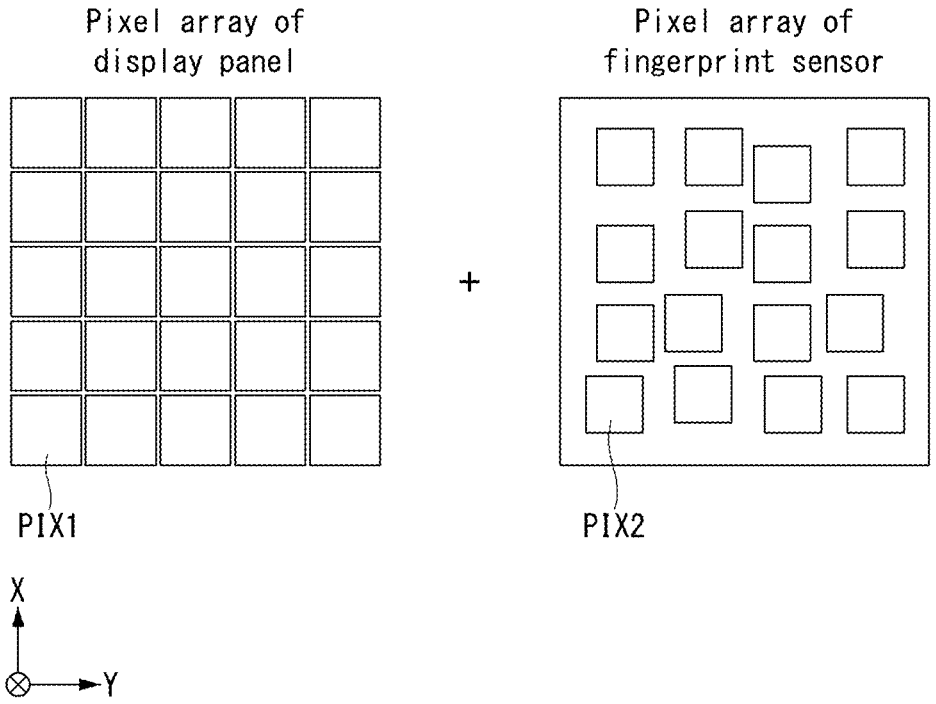
FIG. 22 schematically illustrates a pixel array of a display panel and a pixel array of a fingerprint sensor according to an embodiment of the disclosure.

FIG. 22 schematically illustrates a pixel array of a display panel and a pixel array of a fingerprint sensor according to an embodiment of the disclosure.

As shown in FIG. 22, when photo sensor pixels PIX2 of the fingerprint sensor ISS are non-uniformly disposed, moire interference can be prevented. When display pixels PIX1 of the display panel DPNL and the photo sensor pixels PIX2 of the fingerprint sensor ISS periodically overlap each other, moire interference may be clearly seen. When the photo sensor pixels PIX2 of the fingerprint sensor ISS are non-uniformly disposed, metal lines of a pixel array of the fingerprint sensor ISS are non-uniformly disposed on the semiconductor die. Thus, even when the display pixels PIX1 of the display panel DPNL and the photo sensor pixels PIX2 of the fingerprint sensor ISS overlap each other, periodicity disappears. As a result, moire interference is not seen. This embodiment may be applied to the above-described embodiments of the disclosure.

As described above, the embodiments of the disclosure detect a fingerprint pattern at the opposite side of a fingerprint touch surface touching the user's fingerprint and thus can sense the user's fingerprint on the screen on which an image is displayed. The embodiments of the disclosure can prevent moire interference by optimizing the attachment angle of the fingerprint sensor to the display panel.

The embodiments of the disclosure form a hole in the metal layer and the foam pad and dispose the fingerprint sensor in the hole, thereby securing a light path between the transparent substrate touching the fingerprint and the fingerprint sensor and implementing the slim display device.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:

a display panel configured to receive touch by a user's finger on a display area of the display panel, wherein the display panel has a width and a length, the width being perpendicular to the length; and a fingerprint sensor coupled to the display panel configured to sense light reflected from a fingerprint of the user's finger, wherein the light reflected from the fingerprint is incident on the fingerprint sensor through the display panel, the fingerprint sensor having a length*; and*

*a flexible circuit board on which the fingerprint sensor is mounted, wherein the flexible circuit board includes:*

*a sensor mounting portion on which the fingerprint sensor is mounted; and*

*a tail portion connected to the sensor mounting portion, wherein the tail portion of the flexible circuit board includes:*

*a first tail portion positioned close to the sensor mounting portion; and*

*a second tail portion bent from the first tail portion at a predetermined angle, wherein the fingerprint sensor and the sensor mounting portion of the flexible circuit board are disposed at an angle of 20° to 45° to a reference line,*

*wherein the first tail portion is connected to the sensor mounting portion and is extended at an angle of 20°to 45° to the reference line,* wherein the fingerprint sensor is attached obliquely on the display panel such that the length of the fingerprint sensor is at a predetermined angle to [a] *the* reference line parallel to a long axis of the display panel, and the fingerprint sensor and the display panel are in a same plane.

2. The display device of claim 1, wherein the predetermined angle is an angle of 20° to 45° to the reference line.

[3. The display device of claim 1, further comprising a flexible circuit board on which the fingerprint sensor is mounted, wherein the flexible circuit board includes:

a sensor mounting portion on which the fingerprint sensor is mounted; and a tail portion connected to the sensor mounting portion.]

4. The display device of claim [3] *1*, wherein an attachment direction line of the fingerprint sensor passes through a center of the fingerprint sensor and a center of a width direction of the flexible circuit board and intersects the reference line, wherein an angle of the attachment direction line of the fingerprint sensor with respect to the reference line is 20° to 45°.

[5. The display device of claim 3, wherein the tail portion of the flexible circuit board includes:

a first tail portion positioned close to the sensor mounting portion; and a second tail portion bent from the first tail portion at a predetermined angle.]

6. The display device of claim [5] *1*, [wherein the fingerprint sensor and the sensor mounting portion of the flexible circuit board are disposed at an angle of 20° to 45° to the reference line, wherein the first tail portion is connected to the sensor mounting portion and is extended at an angle of 20° to 45° to the reference line,]

wherein the second tail portion is bent from the first tail portion at an angle of 110° to 135°.

[7. The display device of claim 3,] *A display device comprising:*

*a display panel configured to receive touch by a user's finger on a display area of the display panel, wherein the display panel has a width and a length, the width being perpendicular to the length; and*

*a fingerprint sensor coupled to the display panel configured to sense light reflected from a fingerprint of the user's finger, wherein the light reflected from the fingerprint is incident on the fingerprint sensor through the display panel, the fingerprint sensor having a length; and*

*a flexible circuit board on which the fingerprint sensor is mounted, wherein the flexible circuit board includes:*

*a sensor mounting portion on which the fingerprint sensor is mounted; and*

*a tail portion connected to the sensor mounting portion,* wherein the fingerprint sensor and the sensor mounting portion of the flexible circuit board are disposed at an angle of 20° to 45° to [the] *a* reference line, wherein the tail portion is connected to the sensor mounting portion and is bent from the sensor mounting portion at an angle of 110° to 135°,

*wherein the fingerprint sensor is attached obliquely on the display panel such that the length of the fingerprint sensor is at a predetermined angle to the reference line parallel to a long axis of the display panel, and the fingerprint sensor and the display panel are in a same plane.*

[8. The display device of claim 5, wherein the fingerprint sensor and the sensor mounting portion of the flexible circuit board are disposed at an angle of 20° to 45° to the reference line, wherein the first tail portion is extended parallel to the reference line, wherein the second tail portion is bent from the first tail portion at an angle of 90°.]

[9. The display device of claim 3, wherein the fingerprint sensor is disposed at an angle of 20° to 45° to the reference line, wherein one side of the sensor mounting portion of the flexible circuit board is parallel to the reference line, wherein a long axis of the tail portion of the flexible circuit board is perpendicular to the reference line.]

10. The display device of claim 1, wherein pixels of the fingerprint sensor are arranged non-uniformly.

[11. The display device of claim 1, further comprising:

a foam pad and a metal layer disposed on a side of the display panel where the fingerprint sensor is coupled with, wherein the fingerprint sensor is disposed in a hole of the metal layer, or disposed in a hole of the metal layer and the foam pad.]

12. A mobile information terminal comprising:

a display panel configured to receive touch by a user's finger on a display area of the display panel, wherein the display panel has a width and a length, the width being perpendicular to the length;

a fingerprint sensor coupled to the display panel configured to sense light reflected from a fingerprint of the user's finger, wherein the light reflected from the fingerprint is incident on the fingerprint sensor through the display panel, the fingerprint sensor having a length;

a main board connected to the fingerprint sensor; and a battery connected to the main board, wherein the fingerprint sensor is attached obliquely [at] on the display panel such that the length of the fingerprint sensor is at a predetermined angle to a reference line parallel to a long axis of the display panel, and the fingerprint sensor and the display panel are in a same plane,

*wherein the battery includes a groove accommodating a flexible circuit board on which the fingerprint sensor is mounted.*

13. The mobile information terminal of claim 12, wherein the predetermined angle is an angle of 20° to 45° to the reference line.

14. The mobile information terminal of claim 12, further comprising a flexible circuit board on which the fingerprint sensor is mounted, wherein the flexible circuit board includes:

a sensor mounting portion on which the fingerprint sensor is mounted; and a tail portion connected to the sensor mounting portion and connected to the main board.

15. The mobile information terminal of claim 14, wherein an attachment direction line of the fingerprint sensor passes through a center of the fingerprint sensor and a center of a width direction of the flexible circuit board and intersects the reference line, wherein an angle of the attachment direction line of the fingerprint sensor with respect to the reference line is 20° to 45°.

[16. The mobile information terminal of claim 14, wherein the battery includes a groove accommodating a flexible circuit board on which the fingerprint sensor is mounted.]

17. The mobile information terminal of claim 12, wherein pixels of the fingerprint sensor are arranged non-uniformly.

*18. The display device of claim 1, further comprising:*

*a foam pad and a metal layer disposed on a side of display panel where the fingerprint sensor is coupled with,*

*wherein the fingerprint sensor is disposed in a hole of the metal layer or disposed in a hole of the metal layer and the foam pad.*

*19. The mobile information terminal of claim 12, wherein the fingerprint sensor is attached to a rear surface of the display panel at a location overlapping a fingerprint sensing region of the display panel such that the fingerprint sensor is opposite to the fingerprint sensing region on a screen of the display panel,*

*wherein display pixels from a plurality of display pixels that are included in the fingerprint sensing region of the display panel are configured to emit light responsive to an event requiring fingerprint recognition.*

*20. The mobile information terminal of claim 12, further comprising:*

*a foam pad and a metal layer disposed on a side of the display panel where the fingerprint sensor is coupled with,*

*wherein the fingerprint sensor is disposed in a hole of the metal layer or disposed in a hole of the metal layer and the foam pad.*

* * * * *